(12) United States Patent
Kuang

(10) Patent No.: US 11,963,325 B2
(45) Date of Patent: Apr. 16, 2024

(54) MODULE EJECTION MECHANISM AND EXPANSION ASSEMBLY HAVING THE SAME

(71) Applicant: Wistron Corporation, New Taipei (TW)

(72) Inventor: Lei Kuang, New Taipei (TW)

(73) Assignee: WISTRON CORPORATION, Hsinchu (TW)

( * ) Notice: Subject to any disclaimer, the term of this patent is extended or adjusted under 35 U.S.C. 154(b) by 677 days.

(21) Appl. No.: 17/126,102

(22) Filed: Dec. 18, 2020

(65) Prior Publication Data

US 2022/0124931 A1 Apr. 21, 2022

(30) Foreign Application Priority Data

Oct. 20, 2020 (CN) .......................... 202011124992.0

(51) Int. Cl.
*H05K 7/00* (2006.01)
*H05K 7/14* (2006.01)

(52) U.S. Cl.
CPC ................................ *H05K 7/1411* (2013.01)

(58) Field of Classification Search
CPC .. H05K 7/1411; H05K 5/0217; H05K 5/0247; H05K 5/0295; G06K 13/08; G06K 13/0806; H04Q 1/023; H04Q 1/068
USPC .... 312/334.2, 223.2, 332.1, 9.11, 9.24, 9.25, 312/9.27, 9.28; 439/159, 372, 157; 361/679.38, 754
See application file for complete search history.

(56) References Cited

U.S. PATENT DOCUMENTS

| 5,967,810 | A | * | 10/1999 | Spickler | H01R 13/635 439/159 |
| 6,210,188 | B1 | * | 4/2001 | Chang | G06K 13/0806 439/159 |
| 6,252,514 | B1 | * | 6/2001 | Nolan | G11B 33/128 361/170 |
| 6,991,480 | B2 | * | 1/2006 | Katayanagi | G06K 13/0806 439/64 |
| 7,462,048 | B2 | * | 12/2008 | Chuang | G11B 17/051 439/159 |
| 7,775,816 | B1 | * | 8/2010 | Huang | G11B 33/124 439/159 |
| 8,179,684 | B2 | * | 5/2012 | Smrha | H04Q 1/068 361/752 |
| 9,706,675 | B2 | * | 7/2017 | Hartman | H05K 7/1402 |
| 10,701,464 | B2 | * | 6/2020 | Wilcox | H04Q 1/025 |

(Continued)

FOREIGN PATENT DOCUMENTS

| TW | M467908 U | 12/2013 |
| TW | 201715929 A | 5/2017 |

*Primary Examiner* — Janet M Wilkens
(74) *Attorney, Agent, or Firm* — McClure, Qualey & Rodack, LLP

(57) ABSTRACT

A module ejection mechanism is adapted to be disposed on a rack and carries an expansion module. The module ejection mechanism includes a tray, a linkage member, and an operating member. When one end of the operating member outside the rack is pulled, the other end of the operating member drives the linkage member to pivot. When the linkage member pivots, the linkage member makes the tray move in an ejection direction. When the tray moves in the ejection direction, an abutting element of the tray is adapted to eject the expansion module from the rack.

21 Claims, 19 Drawing Sheets

(56) References Cited

U.S. PATENT DOCUMENTS

2003/0112597 A1\* 6/2003 Smith ................. G06F 1/187
2010/0208423 A1\* 8/2010 Lai .................... G06F 1/187
                                              361/679.38
2017/0115705 A1\* 4/2017 Hsieh ................ G06F 1/185

\* cited by examiner

MODULE EJECTION MECHANISM AND EXPANSION ASSEMBLY HAVING THE SAME

CROSS-REFERENCE TO RELATED APPLICATION

This non-provisional application claims priority under 35 U.S.C. § 119(a) to Patent Application No. 202011124992.0 filed in China, P.R.C. on Oct. 20, 2020, the entire contents of which are hereby incorporated by reference.

BACKGROUND

Technical Field

The present disclosure relates to a module ejection mechanism, and in particular to a module ejection mechanism adapted to eject an expansion module and an expansion assembly including a module ejection mechanism.

Related Art

A cabinet of a rack-mounted server station is generally provided with a plurality of slidable server units. The server units can carry a large quantity of units (for example, hard disks or flash memories), to cooperatively perform big data computing in a cloud. A rack is installed in a chassis of a server, and the rack has a removable expansion card (for example, a graphics processing unit (GPU)), and is electrically connected to an electrical connection port in the rack by using an electrical connection port of the expansion card.

Due to a space limitation in the chassis, a layout space of the rack and the expansion card is relatively limited. Generally, when the expansion card ejects from the rack, the expansion card is grasped by a hand to eject. Considering a space required for grasping the card, notches are made in both a base and an upper cover of the rack, helping the hand to extend into the notches to grasp the expansion card. However, the notches damage the structure of the rack, and reduce the structural strength of the rack.

SUMMARY

In view of this, according to some embodiments, a module ejection mechanism is adapted to be disposed on a rack. The module ejection mechanism includes a tray, a linkage member, and an operating member. The tray is slidably disposed on the rack in an ejection direction. The tray includes an abutting element. The linkage member includes a pivoting portion, a linkage portion, and a resisting portion. The pivoting portion is pivoted on the rack. The operating member includes a grip portion. The other end of the operating member is connected to the linkage portion. When the operating member moves in an operating direction, the operating member is linked with the linkage portion to pivot the linkage member. When the linkage member pivots, the resisting portion enables the tray to move in the ejection direction.

In some embodiments, the operating direction is substantially parallel to the ejection direction. The operating direction is substantially the same as the ejection direction.

In some embodiments, the resisting portion is connected to the tray in a first pivoting-sliding relationship. The other end of the operating member is connected to the linkage portion in a second pivoting-sliding relationship.

In some embodiments, the resisting portion is located between the pivoting portion and the linkage portion, or the linkage portion is located between the pivoting portion and the resisting portion. The operating member moves in a pulling manner in the operating direction.

In some embodiments, the pivoting portion is located between the resisting portion and the linkage portion. The operating member moves in a pushing manner in the operating direction.

In some embodiments, the tray includes a protruding member. The resisting portion is a first long slot. A portion of the protruding member is located in the first long slot. A portion of the protruding member is located on one of two sides of the first long slot.

In some embodiments, the operating member includes a pivoting member. The linkage portion is a second long slot. A portion of the pivoting member is located in the second long slot. A portion of the pivoting member is located on one of two sides of the second long slot.

In some embodiments, the tray includes a groove. A portion of the pivoting member is located in the groove.

In some embodiments, the tray includes a plurality of abutting elements.

In some embodiments, the module ejection mechanism further includes an elastic sheet. One side of the elastic sheet is fixed to the rack. The operating member has two fastening holes. Before the operating member is moved in the operating direction, the elastic sheet on the other side selectively fastens one of the two fastening holes, and after the operating member is moved in the operating direction, the elastic sheet on the other side selectively fastens the other one of the two fastening holes.

In some embodiments, the module ejection mechanism further includes two elastic sheets. One side of each of the elastic sheets is fixed on the rack. The operating member has four fastening holes. Before the operating member is moved in the operating direction, the two elastic sheets on the other two sides selectively fasten two of the four fastening holes, and after the operating member is moved in the operating direction, the two elastic sheets on the other two sides selectively fasten the other two of the four fastening holes.

In some embodiments, a distance between the resisting portion and the pivoting portion is 17.85 mm to 21.85 mm. A distance between the pivoting portion and the linkage portion is 77.85 mm to 81.85 mm.

In some embodiments, a distance between section heights of the tray and the operating member is 3.4 mm to 4.2 mm.

According to some embodiments, an expansion assembly is provided, including a rack and the foregoing module ejection mechanism. The module ejection mechanism includes a tray, a linkage member, and an operating member. The tray is slidably disposed on the rack in an ejection direction. The tray includes an abutting element. The linkage member includes a pivoting portion, a linkage portion, and a resisting portion. The pivoting portion is pivoted on the rack. One end of the operating member includes a grip portion. The other end of the operating member is connected to the linkage portion. The operating member moves in an operating direction, and the operating member is linked with the linkage portion to pivot the linkage member. When the linkage member pivots, the resisting portion enables the tray to move in the ejection direction. The tray includes a plurality of sliding slots, the rack includes a plurality of limiting members. The limiting members are located in the sliding slots in a one-to-one manner. When the tray moves, the limiting members are respectively limited in the sliding slots to make the tray to move in the ejection direction.

In some embodiments, the expansion assembly is adapted to be pluggable to two expansion modules. The expansion assembly includes two module ejection mechanisms and two electrical connection ports. The electrical connection ports are arranged in a staggered manner. The two expansion modules, the two module ejection mechanisms, and the two electrical connection ports are in one-to-one correspondence.

In some embodiments, the grip portion of the module ejection mechanism is exposed from the rack. When the expansion module is ejected, a portion of the expansion module is exposed from the rack, the operating member of the module ejection mechanism is located in the center of the rack substantially, and the operating member of the module ejection mechanism is correspondingly located in the center of the expansion module substantially.

In some embodiments, the operating member of the module ejection mechanism includes a positioning slot. The rack includes a positioning member. A portion of the positioning member is located in the positioning slot, and a portion of the positioning member is selectively located on one of two sides of the positioning slot.

In some embodiments, the operating member of the module ejection mechanism includes a convex portion. The rack includes a limiting slot. A portion of the convex portion is located in the limiting slot, and a portion of the convex portion is selectively located on one of two sides of the limiting slot.

In some embodiments, the resisting portion of the module ejection mechanism substantially corresponds to the center of an electrical connection port of the expansion module.

In some embodiments, the expansion assembly is adapted to be pluggable to a plurality of expansion modules. The expansion assembly includes a plurality of module ejection mechanisms. The plurality of expansion modules and the plurality of module ejection mechanisms are in one-to-one correspondence. The plurality of expansion modules are horizontally disposed in the rack side by side or are vertically disposed in the rack in a stacked manner. The plurality of expansion modules are symmetrically or asymmetrically arranged.

In summary, according to some embodiments, the module ejection mechanism drives the expansion module to eject from the rack. When the operating member of the module ejection mechanism is operated to be moved, the operating member is linked with the linkage member to pivot, and the linkage member drives the tray to move in the ejection direction, so that the expansion module on the tray ejects from the rack. The module ejection mechanism is mounted on the rack, and the structure of the rack does not need to be damaged, to ensure the integrity and the structural strength of the whole rack. In addition, according to some embodiments, the module ejection mechanism is mainly assembled on the rack by using the tray, the linkage member, and the operating member, and the volume of the tray, the linkage member, and the operating member is small, so that a gap between the rack and the expansion module is effectively used for assembly. Moreover, according to some embodiments, the pivoting portion of the linkage member is a pivot point pivoted to the rack, the resisting portion of the linkage member is pivoted to the tray, the operating member is moved, and the linkage portion of the linkage member is driven to pivot, so that the linkage member operates by using a lever, and the resisting portion drives the tray to move in the ejection direction.

DETAILED DESCRIPTION

Figure 1:
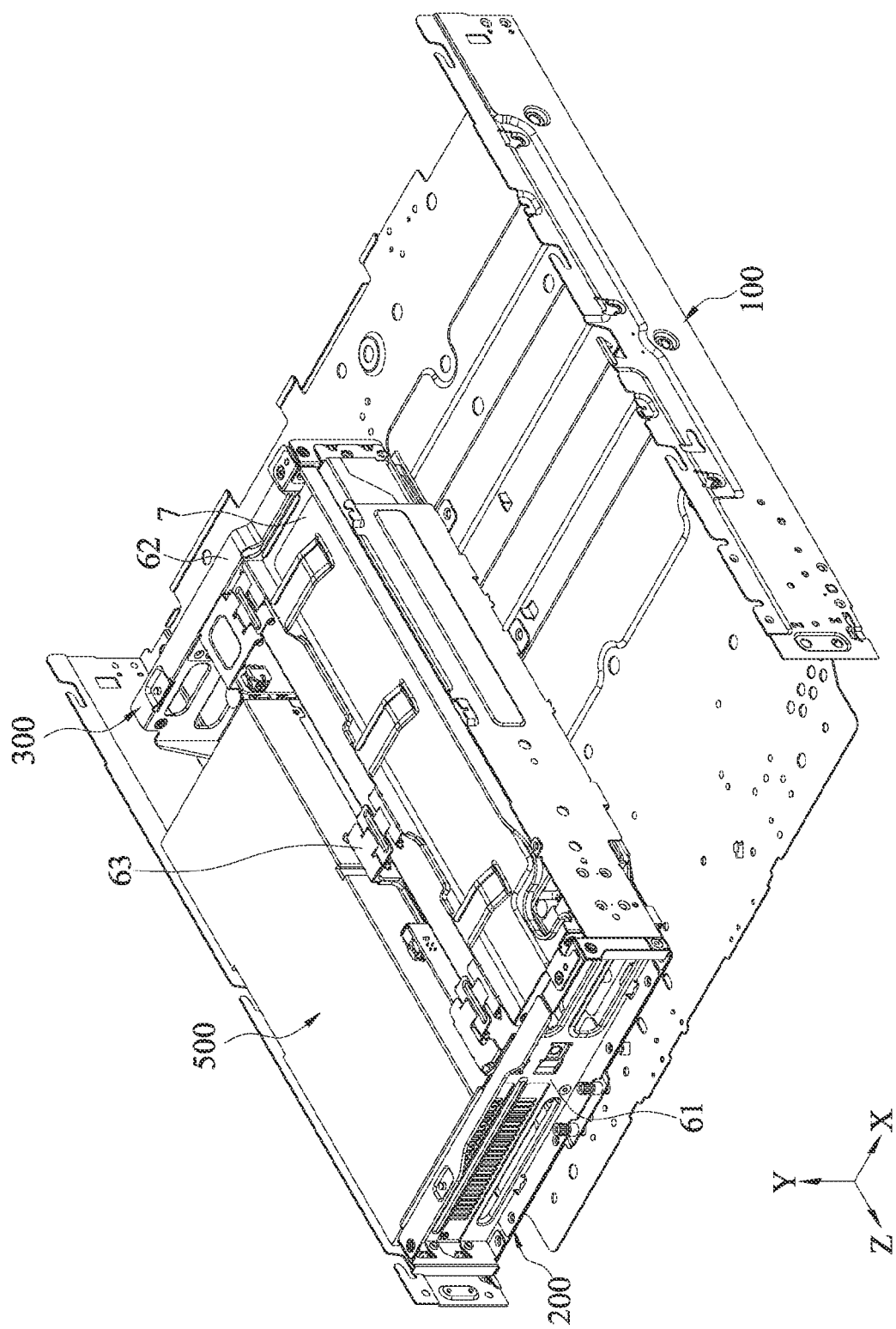
FIG. 1 is a schematic diagram of the appearance of a chassis according to some embodiments, and shows a state of installing an expansion assembly and an expansion module in the chassis.
Figure 2:
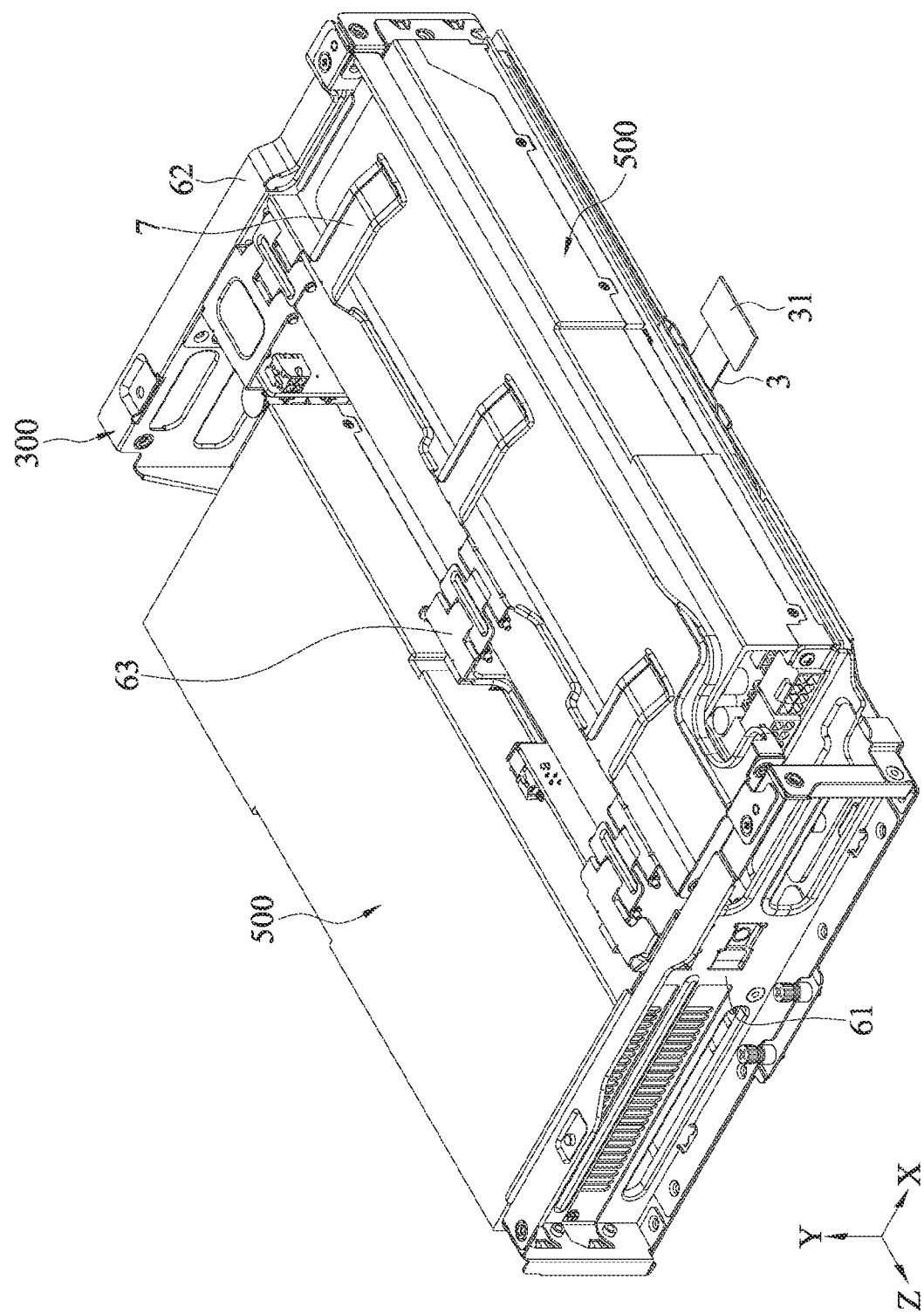
FIG. 2 is a schematic diagram of the appearance of an expansion assembly according to some embodiments, and shows a state of installing two expansion modules in a rack.
Figure 3:
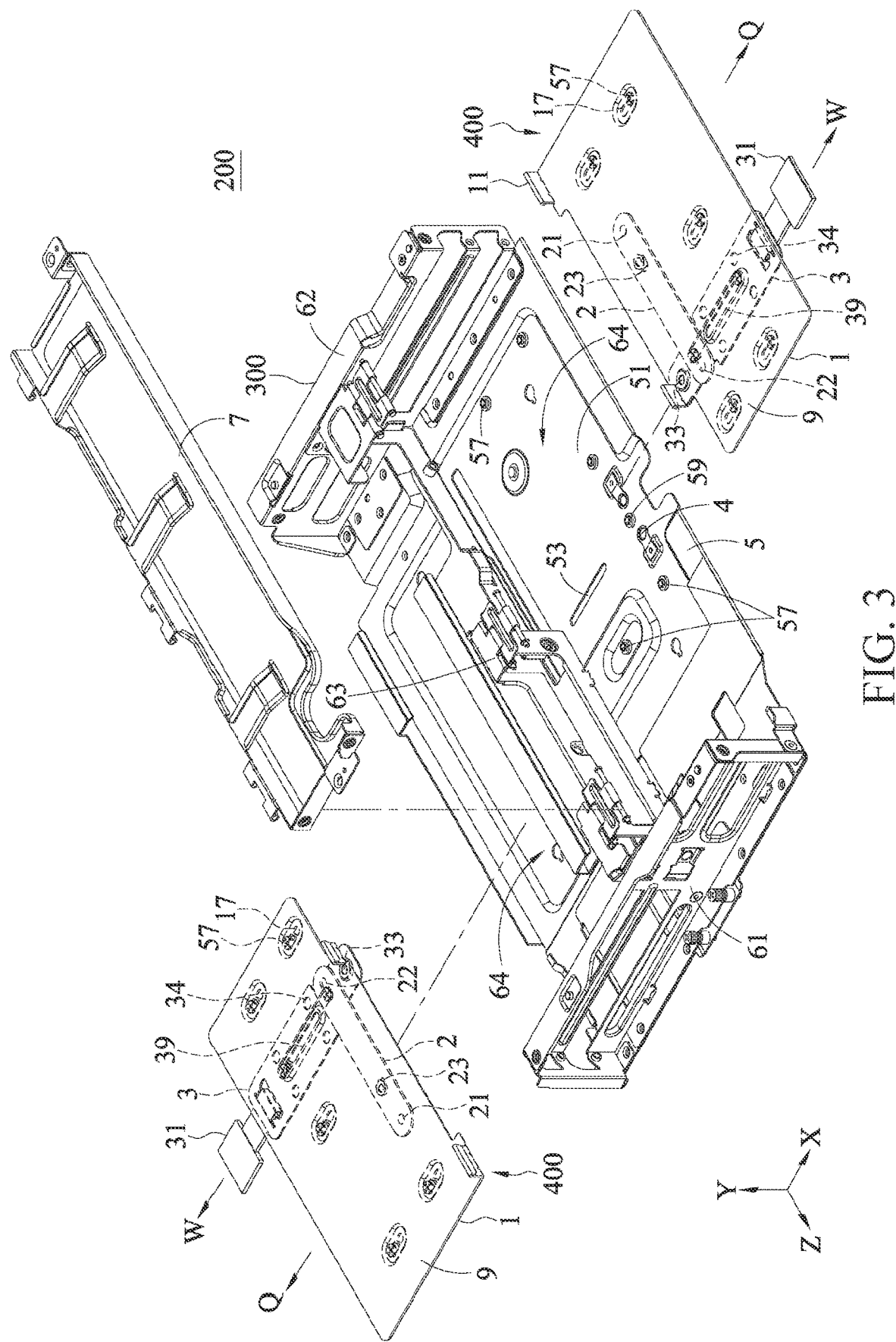
FIG. 3 is a schematic exploded view of an expansion assembly according to some embodiments, and shows a rack, an upper cover, and two module ejection mechanisms, where a sheet is attached above a tray of each module ejection mechanism, and a linkage member and an operating member below the sheet are presented in dotted lines.

Referring to FIG. 1 and FIG. 2, FIG. 1 is a schematic diagram of the appearance of a chassis 100, and shows a state of mounting an expansion assembly 200 and an expansion module 500 in the chassis 100. FIG. 2 is a schematic diagram of the appearance of an expansion assembly 200, and shows a state of mounting two expansion modules 500 in a rack 300. In some embodiments, an expansion assembly 200 is mounted in the chassis 100 of a server. The expansion assembly 200 includes a rack 300 and a module ejection mechanism 400 (as shown in FIG. 3). The module ejection mechanism 400 is located in the rack 300. The rack 300 includes a plurality of pluggable expansion modules 500.

Figure 23:
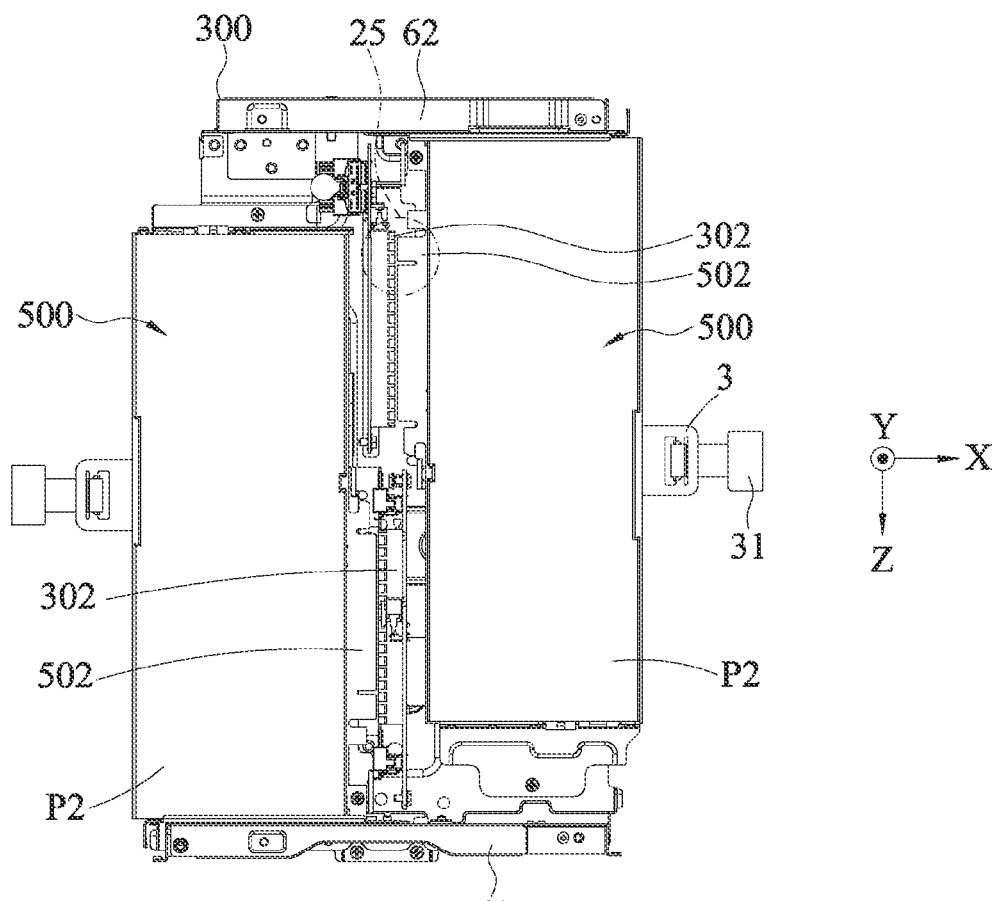
FIG. 23 is a schematic top view of the expansion assembly at a viewing angle of FIG. 2 according to some embodiments, and shows the state of mounting the two expansion modules in the rack and removing the upper cover, and a state after each expansion module ejects from the rack.

In some embodiments, two expansion modules 500 (as shown in FIG. 2) are mounted in the rack 300, but the present invention is not limited thereto. In some embodiments, any quantity of expansion modules 500 (for example, but not limited to one, three, or four) may be mounted in the rack 300. The expansion modules 500 may be arranged symmetrically or asymmetrically (the expansion modules 500 as shown in FIG. 2 and FIG. 23 are arranged symmetrically in a mutual mirroring manner). In some embodiments, the expansion modules 500 are horizontally disposed on two sides of the rack 300, or the expansion modules 500 may be vertically disposed on two sides of the rack 300 (not shown, the expansion module 500 that is horizontally disposed in FIG. 2 rotates by 90 degrees to become an expansion module 500 that is vertically disposed). In some embodiments, the expansion modules 500 may be disposed side by side (as shown in FIG. 2, the mounting structure is described below) or in a stacked manner (not shown, for example, the plurality of expansion modules 500 are stacked on a Y axis in FIG. 2).

Figure 20:
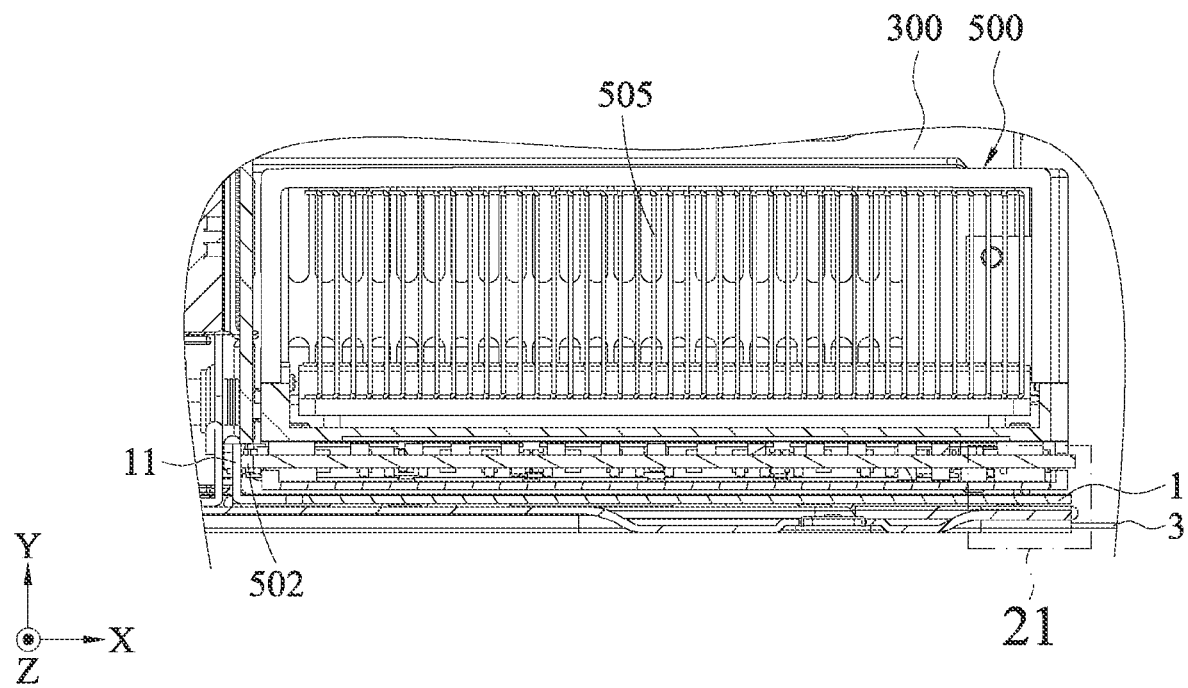
FIG. 20 is a schematic partial cross-sectional diagram of a position labeled 20-20 in FIG. 19, and shows a state that the expansion module is located above the module ejection mechanism.

In some embodiments, each expansion module 500 may be, but not limited to, an expansion card (for example, a graphics processing unit (GPU) card). The expansion module 500 includes an electrical connection port 502 (for example, but not limited to, a circuit board, as shown in FIG. 20) and a heat dissipation module 505 (as shown in FIG. 20). The heat dissipation module 505 is located above the electrical connection port 502. In some embodiments, the expansion module 500 may be another device, for example, a hard disk.

Referring to FIG. 2 and FIG. 3 at the same time, FIG. 3 is a schematic exploded view of an expansion assembly 200, and shows a rack 300, an upper cover 7, and two module ejection mechanisms 400 (or only a single module ejection mechanism 400 may be used), where a sheet 9 is attached above a tray 1 of each module ejection mechanism 400, and a linkage member 2 and an operating member 3 below the sheet 9 are presented in dotted lines. In some embodiments, the module ejection mechanism 400 is adapted to be disposed on various racks 300. The module ejection mechanism 400 may be fixed on the rack 300 and be drawn to eject the expansion module 500, provided that a locking hole is disposed on the rack 300 to pivot the module ejection mechanism 400. The module ejection mechanism 400 includes the tray 1, the linkage member 2, and the operating member 3. In some embodiments, a sheet 9 is attached above the tray 1, and the sheet 9 is made of an insulating material (for example, but not limited to a polyester film (Mylar)). The expansion module 500 is located above the sheet 9, and the expansion module 500 is separated from the tray 1 by using the sheet 9, to avoid a short circuit problem caused when components of the expansion module 500 are in contact with the tray 1 excluding that the abutting element 11 of the tray 1 is in contact with the electrical connection port 502 (an insulation portion of a side end of the circuit board) of the expansion module 500. Description is made below.

Figure 4:
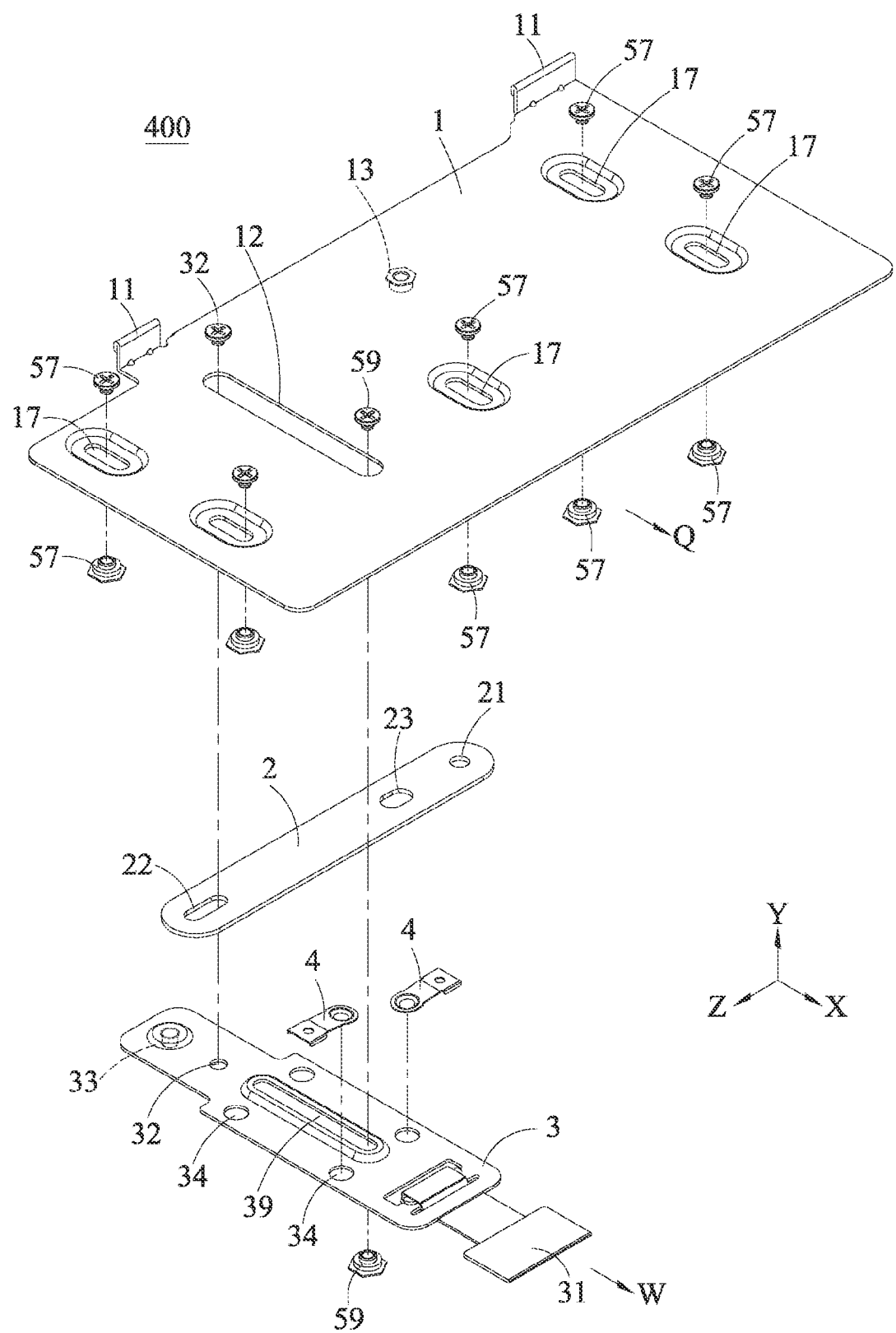
FIG. 4 is a schematic exploded view of a module ejection mechanism according to some embodiments, and shows a state that no sheet is attached above the tray of the module ejection mechanism.
Figure 5:
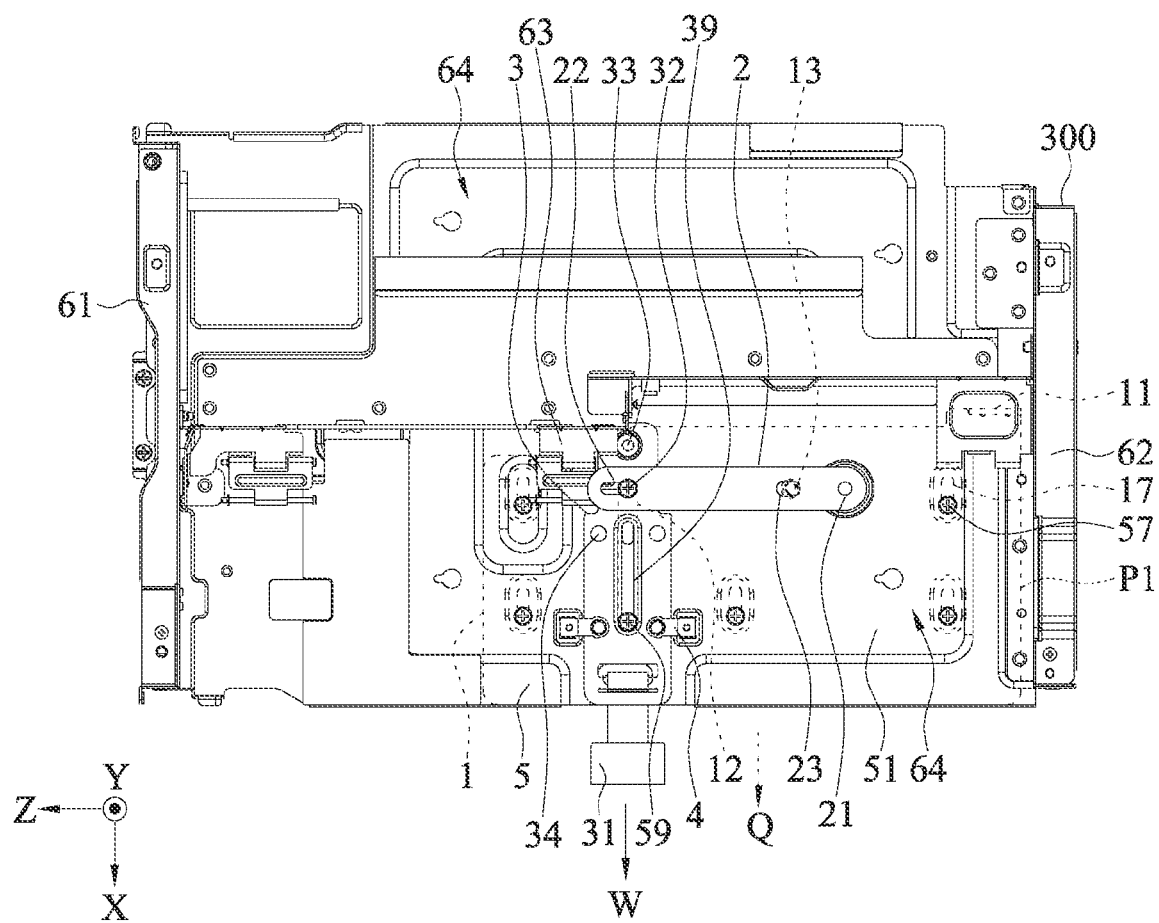
FIG. 5 is a schematic top view of the expansion assembly at a viewing angle of FIG. 3 according to some embodiments, and shows a state of preserving a group of module ejection mechanisms on the rack and a state before the module ejection mechanisms are pulled, where the tray is presented in dotted lines.

Referring to FIG. 2 to FIG. 4 at the same time, FIG. 4 is a schematic exploded view of the module ejection mechanism 400, and shows a state that the sheet 9 is not attached above the tray 1 of the module ejection mechanism 400. In some embodiments, the tray 1 is slidably disposed on the rack 300 in an ejection direction Q (for example, but not limited to, the direction indicated by the X-axis arrow shown in FIG. 3, and description is made below). The tray 1 includes a plurality of abutting element 11. The linkage member 2 includes a pivoting portion 21, a linkage portion 22, and a resisting portion 23. The pivoting portion 21 is pivoted on the rack 300 (as shown in FIG. 5). The pivoting portion 21 is a rotating shaft end, and the linkage portion 22 is a free end. One end of the operating member 3 includes a grip portion 31, the other end of the operating member 3 is connected to the linkage portion 22. When the operating member 3 moves in an operating direction W (for example, but not limited to the direction indicated by the X-axis arrow shown in FIG. 3, and description is made below).

Figure 6:
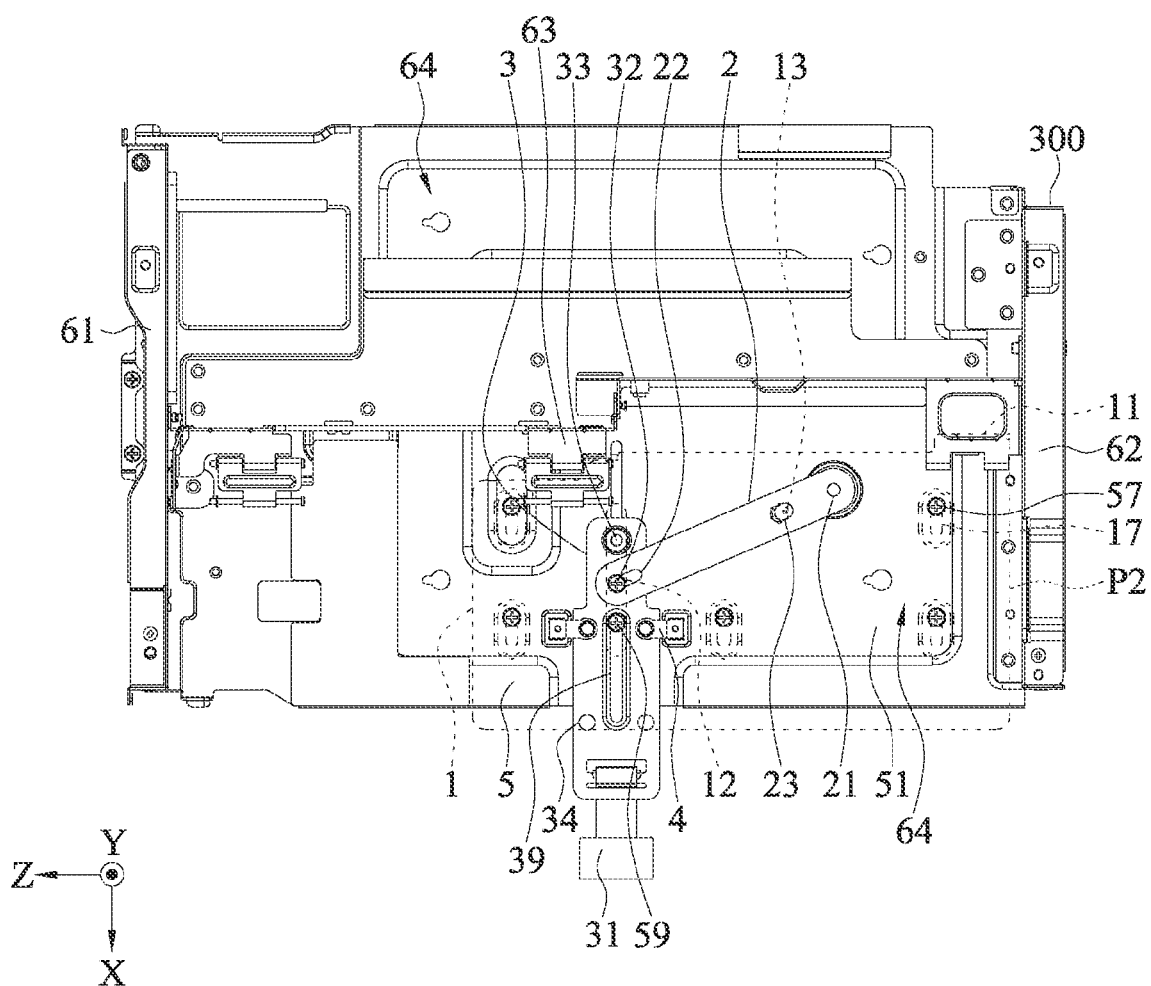
FIG. 6 is a schematic top view of the expansion assembly at a viewing angle of FIG. 3 according to some embodiments, and shows a state of preserving a group of module ejection mechanisms on the rack and a state after the module ejection mechanisms are pulled, where the tray is presented in dotted lines.

Referring to FIG. 4 to FIG. 6 at the same time, FIG. 5 is a schematic top view of the expansion assembly 200 at a viewing angle of FIG. 3, and shows a state of preserving a group of module ejection mechanisms 400 on the rack 300 and a state before the module ejection mechanisms 400 are pulled, where the tray 1 is presented in dotted lines. FIG. 6 is a schematic top view of the expansion assembly 200 at a viewing angle of FIG. 3, and shows a state of preserving a group of module ejection mechanisms 400 on the rack 300 and a state after the module ejection mechanisms 400 are pulled, where the tray 1 is presented in dotted lines. In some embodiments, when intending to move the operating member 3 in the operating direction W, a user first grips a grip portion 31 at one end of the operating member 3 and pulls the grip portion out in a direction opposite to the rack 300, so that the other end of the operating member 3 drives the linkage portion 22 to rotate. When the linkage member 2 rotates, the linkage member 2 pivots by using the pivoting portion 21 pivoted to the rack 300 as a shaft portion. Because the resisting portion 23 on the linkage member 2 is connected to the tray 1, the resisting portion 23 drives the tray 1 to move in the ejection direction Q. When the tray 1 is driven and moves in the ejection direction Q, the abutting element 11 of the tray 1 ejects the expansion module 500 from the rack 300 (as shown in FIG. 23).

Referring to FIG. 4 to FIG. 6 at the same time, in some embodiments, the other end of the operating member 3 is connected to the linkage portion 22. The connection may be, but is not limited to the following: 1, when the operating member 3 does not move, the other end of the operating member 3 is in contact connection to the linkage portion 22, and when the operating member 3 moves, the other end of the operating member 3 is also in contact connection to the linkage portion 22; or 2, when the operating member 3 does not move, the other end of the operating member 3 is not in contact connection to the linkage portion 22, and only when the operating member 3 moves, the other end of the operating member 3 in contact connection to the linkage portion 22.

Figure 7:
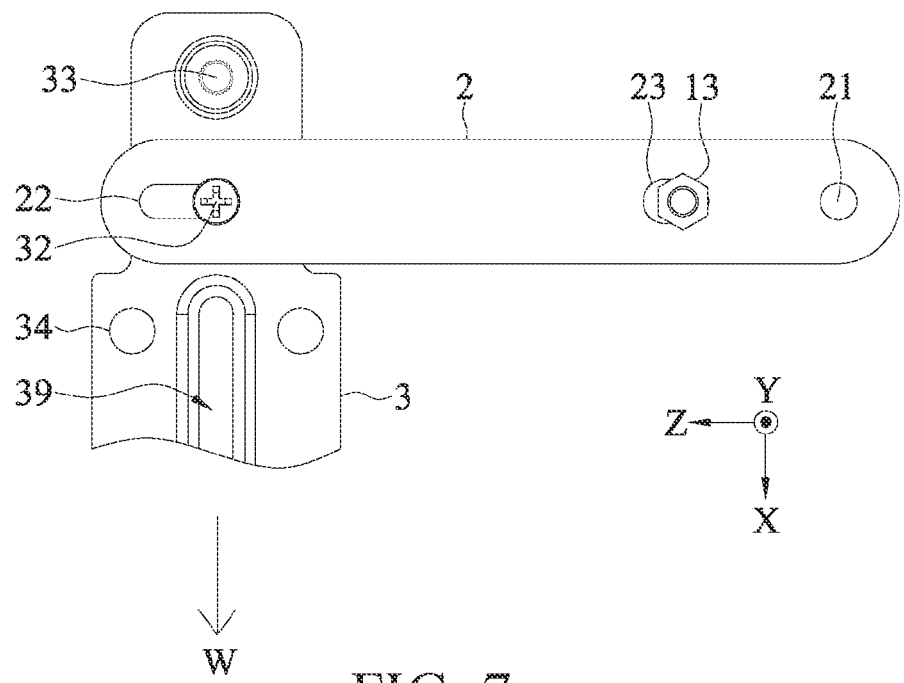
FIG. 7 is a schematic partial top view of the linkage member and the operating member in FIG. 5, and shows a state before the operating member is pulled, where the resisting portion is located between the pivoting portion and the linkage portion.
Figure 8:
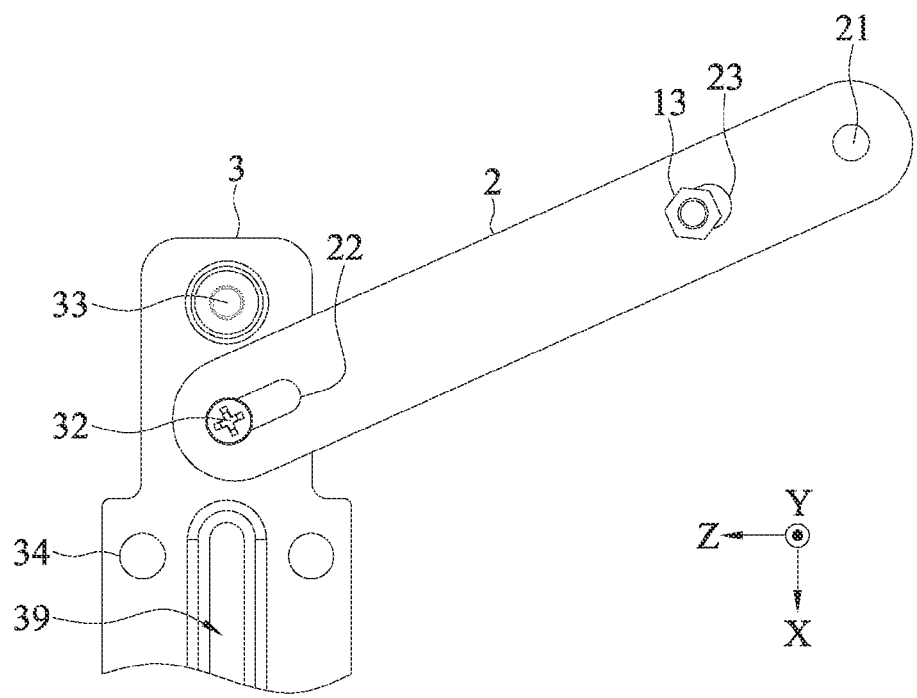
FIG. 8 is a schematic partial top view of the linkage member and the operating member in FIG. 6, and shows a state after the operating member is pulled, where the resisting portion is located between the pivoting portion and the linkage portion.

Referring to FIG. 4, FIG. 7, and FIG. 8 at the same time, FIG. 7 is a schematic partial top view of the linkage member 2 and the operating member 3 in FIG. 5, and shows a state before the operating member 3 is pulled, where the resisting portion 23 is located between the pivoting portion 21 and the linkage portion 22. FIG. 8 is a schematic partial top view of the linkage member 2 and the operating member 3 in FIG. 6, and shows a state after the operating member 3 is pulled, where the resisting portion 23 is located between the pivoting portion 21 and the linkage portion 22. In some embodiments, the resisting portion 23 is a long slot (a first long slot 23 is used as an example for description below and is given the same reference numeral as the resisting portion 23), the linkage portion 22 is a long slot (a second long slot 22 is used as an example for description below and is given the same reference numeral as the linkage portion 22). A length of the first long slot 23 is less than a length of the second long slot 22.

Referring to FIG. 4, FIG. 7, and FIG. 8 at the same time, in some embodiments, the operating member 3 includes a pivoting member 32. The pivoting member 32 includes a locking member 32 (for example, but not limited to a screw, the locking member 32 is used as an example for description below and is given the same reference numeral as the pivoting member 32). The locking member 32 passes through a groove 12 and the second long slot 22 of the tray 1 and is locked to the operating member 3. The locking member 32 is limited in the groove 12 to limit a degree of freedom of the operating member 3 (can only move on the X axis) on the Y axis and the Z axis as shown in FIG. 6. In some embodiments, a portion of the locking member 32 is located in the second long slot 22, and a portion of the locking member 32 is selectively located on one of two sides of the second long slot 22, and passes through the second long slot 22, so that the other end of the operating member 3 is in contact connection to the linkage portion 22.

Referring to FIG. 4 at the same time, in some embodiments, the operating direction W is substantially parallel to the ejection direction Q, the movement of the operating member 3 in the operating direction W is movement in a direction of an X-axis arrow shown in FIG. 4, and the ejection direction Q is the movement in the direction of the X-axis arrow shown in FIG. 4, but the present invention is not limited thereto. In some embodiments, the operating direction W is not parallel to the ejection direction Q (not shown). The movement of the operating member 3 in the operating direction W is different from that in the direction of the X-axis arrow shown in FIG. 4, and a moving direction of the operating member is shown in FIG. 4 and has an included angle with the X axis. For example, an angle is selected within an optional range of 90 degrees (for example, a range of 20 degrees to 70 degrees) between the X axis and the Z axis.

Referring to FIG. 4, FIG. 5, and FIG. 6, in some embodiments, the operating member 3 includes a positioning slot 39. The positioning slot 39 is a long slot. The rack 300 includes a positioning member 59. The positioning member 59 may be a locking member 59 and an engaging member 59 (for example, but not limited to a screw and a nut, the locking member 59 and the engaging member 59 are used as an example for description below and are given the same reference numerals as the positioning member 59). The engaging member 59 is riveted to the rack 300. The locking member 59 passes through the groove 12, the positioning slot 39 is locked to the engaging member 59. The locking member 59 and the engaging member 59 are limited in the groove 12 and the positioning slot 39 to limit the degree of freedom of the operating member 3 (can only slide on the X axis) on the Y axis and the Z axis as shown in FIG. 6. When the user intends to move the tray 1, a portion of the positioning member 59 is located in the positioning slot 39, a portion of the positioning member 59 is selectively located on one of two sides of the positioning slot 39, and the positioning member 59 is limited in the positioning slot 39 to make the tray 1 to move in the ejection direction Q.

Referring to FIG. 3 and FIG. 4, in some embodiments, the operating member 3 includes a convex portion 33, and the convex portion 33 is a riveting member (a cylinder presented in dotted lines in FIG. 4). The rack 300 includes a limiting slot 53. The limiting slot 53 is a long slot. A portion of the convex portion 33 is located in the limiting slot 53. A portion of the convex portion 33 is selectively located on one of two sides of the limiting slot 53. In some embodiments, the convex portion 33 may be a locking member and an engaging member (for example, but not limited to a screw and a nut), the locking member is locked to the operating member 3, and the locking member passes through the limiting slot 53 and is locked to the engaging member.

Referring to FIG. 4 to FIG. 6 at the same time, in some embodiments, the operating direction W is substantially the same as the ejection direction Q, and the movement of the operating member 3 in the operating direction W is, for example, but not limited to the following: When the user pulls the operating member 3 in the direction far away from the rack 300, the tray 1 is slidably disposed on the rack 300 in the ejection direction Q, so that the tray 1 drives the expansion module 500 to eject in the direction far away from the rack 300 (as shown in FIG. 23), but the present invention is not limited thereto. In some embodiments, the operating direction W is substantially different from the ejection direction Q, and the movement of the operating member 3 in the operating direction W is, for example, but not limited to the following: When the user pushes the operating member 3 in the direction toward the inside of the rack 300 (pushes the operating member upward opposite to the operating direction W shown in FIG. 5, referring to FIG. 11 at the same time), the tray 1 is slidably disposed on the rack 300 in the ejection direction Q, so that the tray 1 drives the expansion module 500 to eject in the direction far away from the rack 300.

Referring to FIG. 4, FIG. 7, and FIG. 8 at the same time, in some embodiments, the resisting portion 23 is connected to the tray 1 in a first pivoting-sliding relationship. The other end of the operating member 3 is connected to the linkage portion 22 in a second pivoting-sliding relationship. The first pivoting-sliding relationship and the second pivoting-sliding relationship may be, but not limited to, a connection manner in which the two elements have a pivotable relationship to each other and an axially movable relationship to each other, and description is made below.

Referring to FIG. 4, FIG. 7, and FIG. 8 at the same time, in some embodiments, the resisting portion 23 is located between the pivoting portion 21 and the linkage portion 22, and the operating member 3 moves in a pulling manner in the operating direction W. The tray 1 includes a protruding member 13. The protruding member 13 is a steel column (the steel column 13 is used as an example for description below and is given the same reference numeral as the protruding member 13). A portion of the protruding member 13 is located in the first long slot 23, and a portion of the protruding member 13 is selectively located on one of two sides of the first long slot 23.

Referring to FIG. 4, FIG. 7, and FIG. 8 at the same time, in some embodiments, the steel column 13 is riveted to the tray 1, and the structural strength of the steel column 13 itself provides durability. In some embodiments, the steel column 13 may be a locking member and an engaging member (for example, but not limited to a screw and a nut), the locking member is locked to the tray 1. The locking member passes through the first long slot 23 and is locked to the engaging member.

Referring to FIG. 4, FIG. 7, and FIG. 8 at the same time, in some embodiments, a distance between the resisting portion 23 and the pivoting portion 21 is 17.85 mm to 21.85 mm, for example, but not limited to, 18.85 mm, 19.85 mm, or 20.85 mm, and a distance between the pivoting portion 21 and the linkage portion 22 is 77.85 mm to 81.85 mm, for example, but not limited to 78.85 mm, 79.85 mm or 80.85 mm.

Referring to FIG. 4, FIG. 7, and FIG. 8 at the same time, in some embodiments, a ratio of the distance between the pivoting portion 21 and the linkage portion 22 to the distance between the pivoting portion 21 and the resisting portion 23 is 4:1. The ratio of 4:1 is merely an example, but is not limited thereto. In some embodiments, the ratio may be further 3:1 or 2:1 (not shown). In some embodiments, the distance between the pivoting portion 21 and the linkage portion 22 is different from the distance between the resisting portion 23 and the pivoting portion 21. Therefore, when the linkage member 2 is pivoted, a movement travel of the protruding member 13 in the first long slot 23 is different from a movement travel of the pivoting member 32 in the second long slot 22. In some embodiments, a moving speed of the protruding member 13 in the first long slot 23 is low, and the pivoting member 32 in the second long slot 22 moves quickly. In some embodiments, the distance between the linkage portion 22 and the pivoting portion 21 is greater than the distance between the resisting portion 23 and the pivoting portion 21. Therefore, the user pulls the operating member 3, so that a labor-saving operation effect of the linkage member 2 operating by using a lever is achieved. In some embodiments, the resisting portion 23 of the linkage member 2 includes a first long slot 23 for the protruding member 13 on the tray 1 to connect, and the linkage member 2 performs the first pivoting-sliding relationship between pivoting and axial movement relative to the tray 1. In some embodiments, the linkage portion 22 of the linkage member 2 includes a second long slot 22 for the pivoting member 32 of the operating member 3 to connect, and the operating member 3 performs the second pivoting-sliding relationship between pivoting and axial movement relative to the linkage member 2.

Referring to FIG. 5 to FIG. 8 at the same time, in some embodiments, when the user intends to pull the tray 1 from a first position P1 in the rack 300 to a second position P2 in which a portion of the tray 1 is partially exposed from the rack 300, a portion of the protruding member 13 moves from one side of the first long slot 23 to the other side of the first long slot 23, and a portion of the pivoting member 32 moves from one side of the second long slot 22 to the other side of the second long slot 22.

Referring to FIG. 3 and FIG. 4 at the same time, in some embodiments, the tray 1 includes a groove 12. The groove 12 is parallel to the operating direction W, and a portion of the pivoting member 32 is located in the groove 12. When the linkage member 2 is pivoted, a portion of the pivoting member 32 slides in the groove 12, so that the operating member 3 is limited to moving in the operating direction W.

Figure 9:
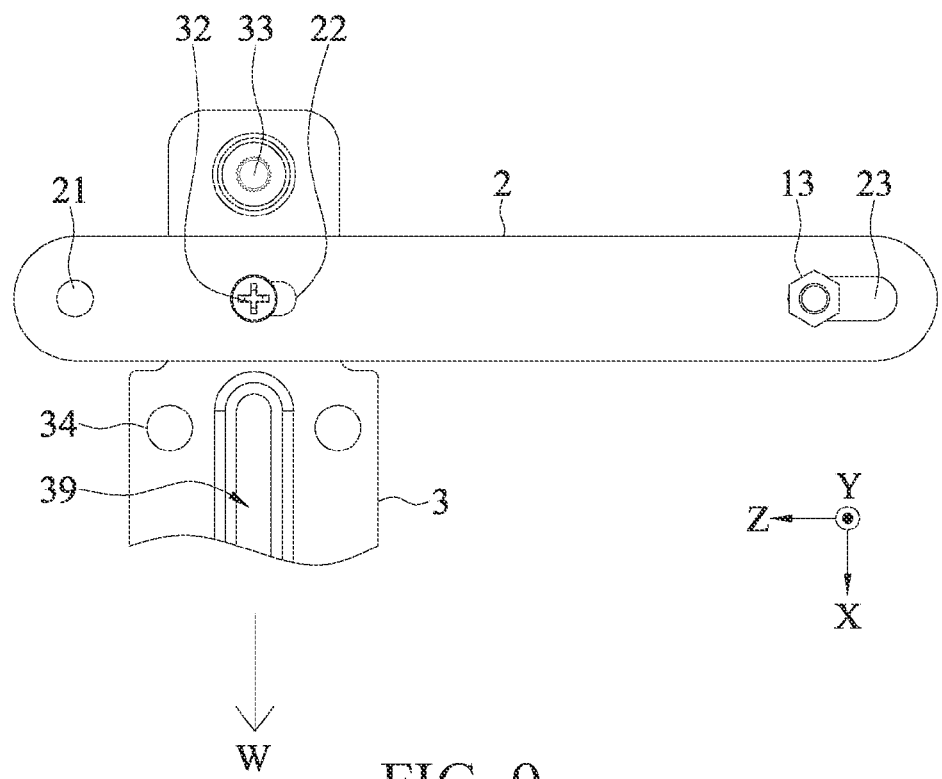
FIG. 9 is a schematic partial top view of the linkage member and the operating member in FIG. 7, and shows a state before the operating member is pulled, where the linkage portion is located between the pivoting portion and the resisting portion.
Figure 10:
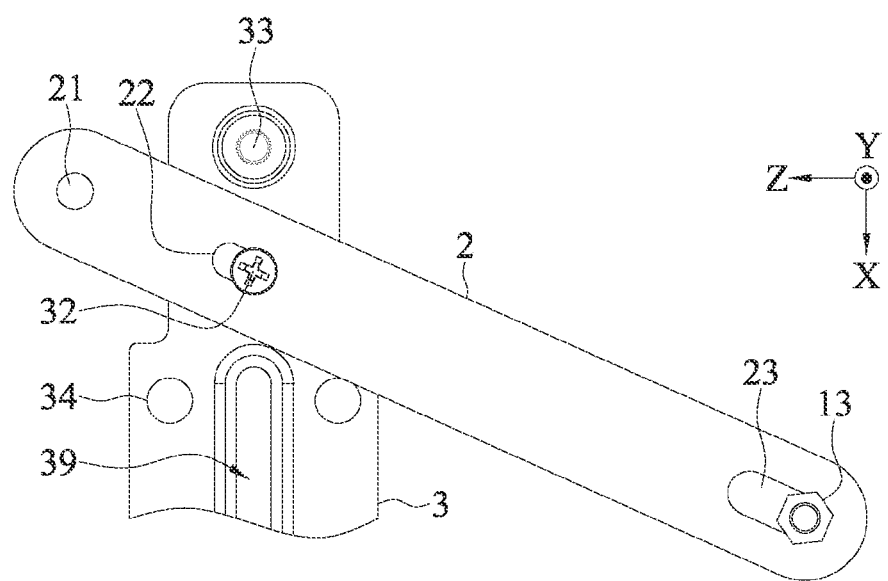
FIG. 10 is a schematic partial top view of the linkage member and the operating member in FIG. 8, and shows a state after the operating member is pulled, where the linkage portion is located between the pivoting portion and the resisting portion.

Referring to FIG. 9 and FIG. 10 at the same time, FIG. 9 is a schematic partial top view of the linkage member 2 and the operating member 3 in FIG. 7, and shows a state before the operating member 3 is pulled, where the linkage portion 22 is located between the pivoting portion 21 and the resisting portion 23. FIG. 10 is a schematic partial top view of the linkage member 2 and the operating member 3 in FIG. 8, and shows a state after the operating member 3 is pulled, where the linkage portion 22 is located between the pivoting portion 21 and the resisting portion 23. In some embodiments, the linkage portion 22 is located between the pivoting portion 21 and the resisting portion 23, and the operating member 3 moves in a pulling manner in the operating direction W. In some embodiments, the length of the first long slot 23 is greater than the length of the second long slot 22.

Referring to FIG. 9 and FIG. 10 at the same time, in some embodiments, the ratio of the distance between the pivoting portion 21 and the linkage portion 22 to the distance between the pivoting portion 21 and the resisting portion 23 is 1:4. The ratio of 1:4 is merely an example, but is not limited thereto. In some embodiments, the ratio may be further 1:3 or 1:2 (not shown). In some embodiments, the distance between the pivoting portion 21 and the linkage portion 22 is different from the distance between the resisting portion 23 and the pivoting portion 21. Therefore, when the linkage member 2 is pivoted, a movement travel of the protruding member 13 in the first long slot 23 is different from a movement travel of the pivoting member 32 in the second long slot 22. In some embodiments, a moving speed of the protruding member 13 in the first long slot 23 is high, and the pivoting member 32 in the second long slot 22 moves slowly. Therefore, the user pulls the operating member 3, so that the operating effect of the linkage member 2 operating by using the lever is achieved.

Figure 11:
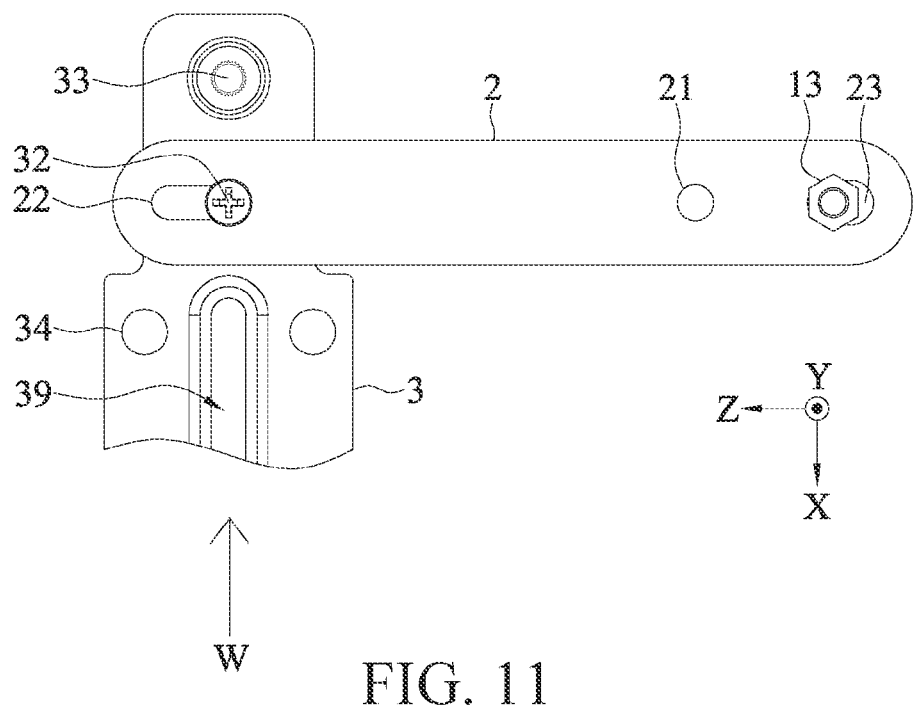
FIG. 11 is a schematic partial top view of the linkage member and the operating member in FIG. 7, and shows a state before the operating member is pushed, where the pivoting portion is located between the resisting portion and the linkage portion.
Figure 12:
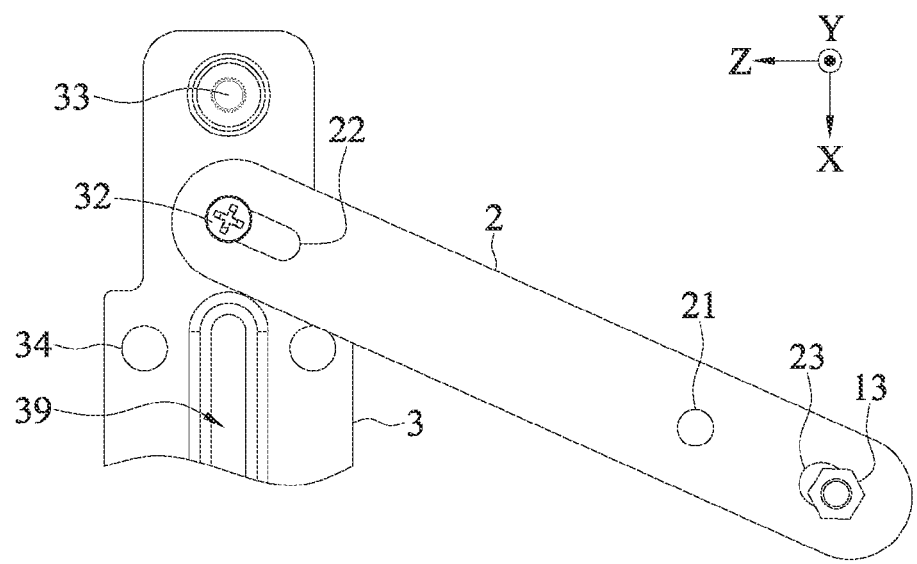
FIG. 12 is a schematic partial top view of the linkage member and the operating member in FIG. 8, and shows a state after the operating member is pushed, where the pivoting portion is located between the resisting portion and the linkage portion.

Referring to FIG. 11 and FIG. 12 at the same time, FIG. 11 is a schematic partial top view of the linkage member 2 and the operating member 3 in FIG. 7, and shows a state before the operating member 3 is pushed, where the pivoting portion 21 is located between the resisting portion 23 and the linkage portion 22. FIG. 12 is a schematic partial top view of the linkage member 2 and the operating member 3 in FIG. 8, and shows a state after the operating member 3 is pushed, where the pivoting portion 21 is located between the resisting portion 23 and the linkage portion 22. In some embodiments, the pivoting portion 21 is located between the resisting portion 23 and the linkage portion 22, and the operating member 3 moves in a pushing manner in the operating direction W. In some embodiments, the length of the first long slot 23 is less than the length of the second long slot 22.

Referring to FIG. 11 and FIG. 12 at the same time, in some embodiments, the ratio of the distance between the pivoting portion 21 and the linkage portion 22 to the distance between the pivoting portion 21 and the resisting portion 23 is 4:1. The ratio of 4:1 is merely an example, but is not limited thereto. In some embodiments, the ratio may be further 3:1 or 2:1 (not shown). In some embodiments, the distance between the pivoting portion 21 and the linkage portion 22 is different from the distance between the resisting portion 23 and the pivoting portion 21. Therefore, when the linkage member 2 is pivoted, a movement travel of the protruding member 13 in the first long slot 23 is different from a movement travel of the pivoting member 32 in the second long slot 22. The distance between the linkage portion 22 and the pivoting portion 21 is greater than the distance between the resisting portion 23 and the pivoting portion 21. Therefore, the user may push the operating member 3, so that a labor-saving operation effect of the linkage member 2 operating by using a lever is achieved.

Figure 16:
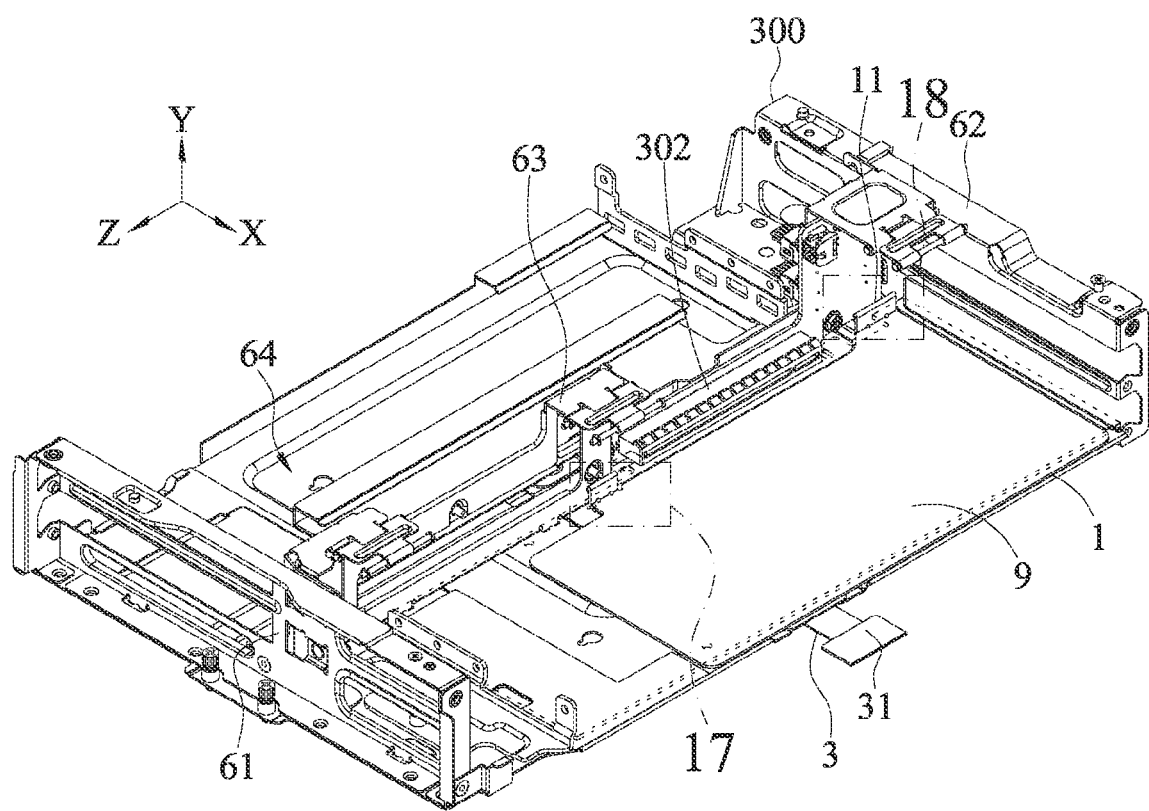
FIG. 16 is a schematic top view of the expansion assembly at a viewing angle of FIG. 3 according to some embodiments, and shows the state of preserving a group of module ejection mechanisms on the rack and the state before the module ejection mechanisms are pulled, where the electrical connection port of the expansion module is a circuit board and is presented in dotted lines.
Figure 17:
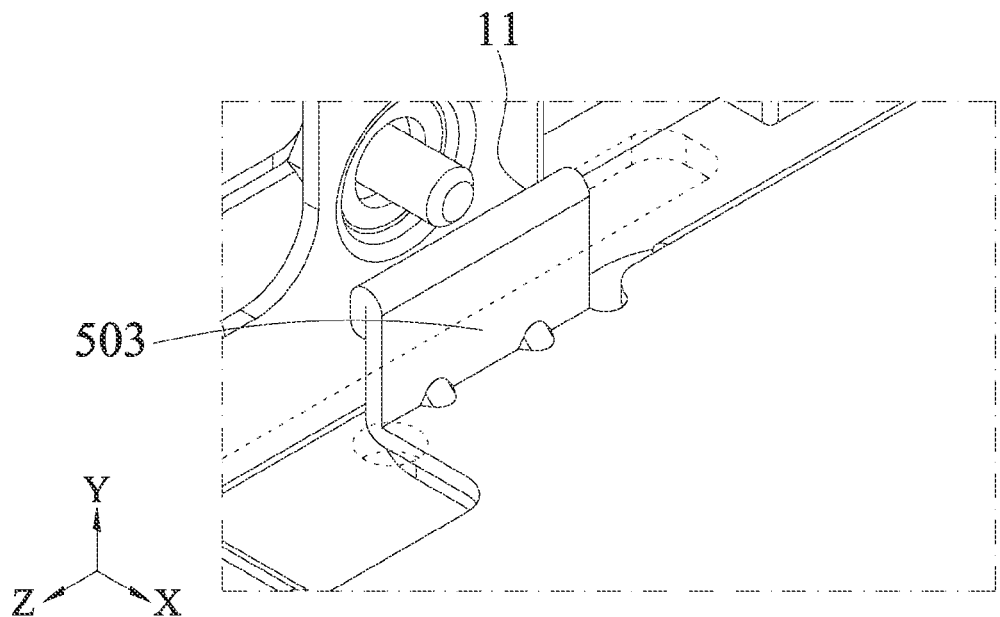
FIG. 17 is an enlarged schematic view of a center line box labeled 17 in FIG. 16, and shows a state that the abutting element is located on one side of the electrical connection port.
Figure 18:
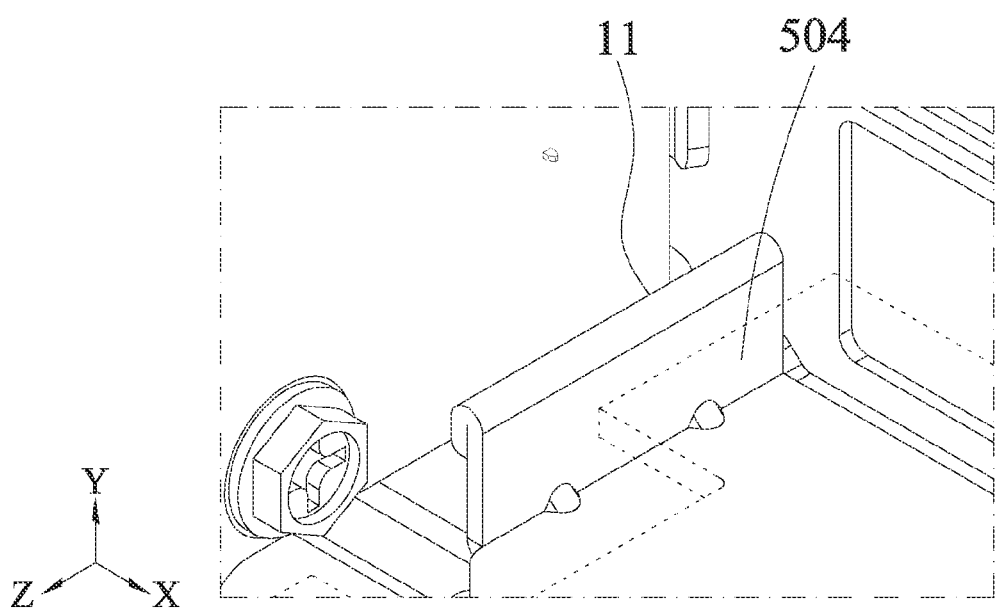
FIG. 18 is an enlarged schematic view of a center line box labeled 18 in FIG. 16, and shows a state that the abutting element is located on the other side of the electrical connection port.

Referring to FIG. 4, and FIG. 16 to FIG. 18 at the same time, FIG. 16 is a schematic top view of the expansion assembly 200 at a viewing angle of FIG. 3, and shows the state of preserving a group of module ejection mechanisms 400 on the rack 300 and the state before the module ejection mechanisms 400 are pulled, where the electrical connection port 502 of the expansion module 500 is a circuit board and is presented in dotted lines. FIG. 17 is an enlarged schematic view of a center line box labeled 17 in FIG. 16, and shows a state that the abutting element 11 is located on one side of the electrical connection port 502. FIG. 18 is an enlarged schematic view of a center line box labeled 18 in FIG. 16, and shows a state that the abutting element 11 is located on the other side of the electrical connection port 502. In some embodiments, the tray 1 includes one or more (for example, but not limited to, two, three, or four) abutting elements 11. Two abutting elements 11 are used as an example for description below. The expansion module 500 includes an electrical connection port 502. The two abutting elements 11 correspond to a first side end 503 and a second side end 504 on two sides of the electrical connection port 502 respectively, and the second side end 504 is a protruding block. In some embodiments, when the tray 1 is moved in the ejection direction Q, the abutting elements 11 are located on the two sides of the electrical connection port 502 respectively to push, so that the two sides of the electrical connection port 502 are averagely forced, to actually eject the expansion module 500.

Referring to FIG. 3 and FIG. 4 at the same time, in some embodiments, the module ejection mechanism 400 includes two elastic sheets 4. One side of each elastic sheet 4 is fixed on the rack 300, and the operating member 3 has four fastening holes 34. Before the user intends to move the operating member 3 in the operating direction W, the two elastic sheets 4 on the other two sides selectively fasten two of the four fastening holes 34, and the operating member 3 is in an initial state before being pulled. After the user intends to move the operating member 3 in the operating direction W, the two elastic sheets 4 on the other two sides selectively fasten the other two of the four fastening holes 34, and the operating member 3 is in a final state after being pulled.

In some embodiments, the module ejection mechanism 400 includes an elastic sheet 4 (not shown, for example, two elastic sheets 4 in FIG. 4 are reduced by one). One side of the elastic sheet 4 is fixed to the rack 300. The operating member 3 has two fastening holes 34 (not shown, for example, in FIG. 4, two fastening holes 34 on a left side or two fastening holes 34 on a right side are removed, and one corresponding elastic sheet 4 selectively performs fastening). Before the user intends to move the operating member 3 in the operating direction W, the elastic sheet 4 on the other side selectively fastens one of the two fastening holes 34. After the user intends to move the operating member 3 in the operating direction W, the elastic sheet 4 on the other side selectively fastens the other one of the two fastening holes 34. The elastic sheet 4 is provided for fastening the fastening holes 34 to provide a feeling of operating the operating member 3 in place.

Figure 21:
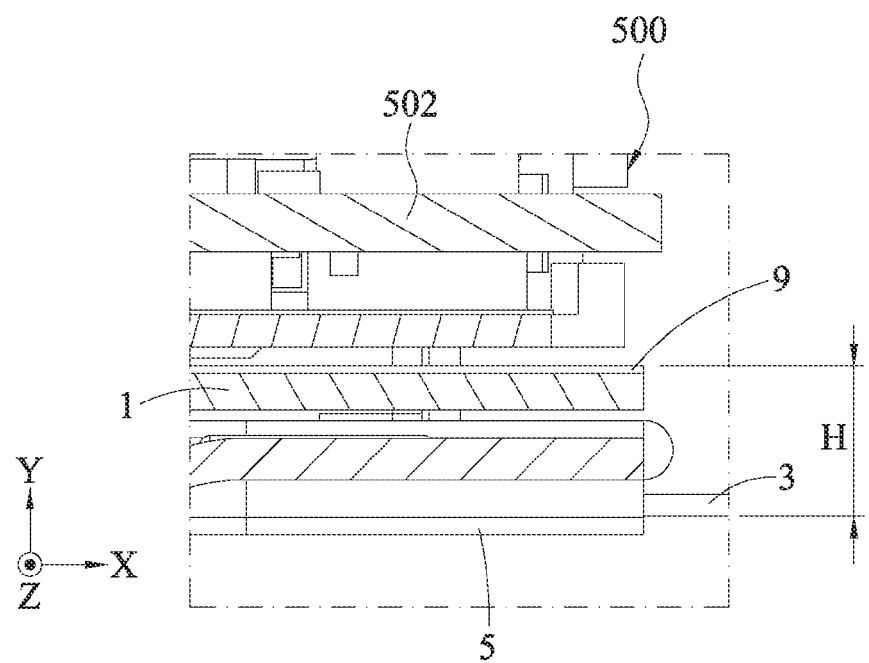
FIG. 21 is an enlarged schematic view of a center line box labeled 21 in FIG. 20, and shows a section height of the module ejection mechanism on the rack.

Referring to FIG. 3 and FIG. 4 at the same time, in some embodiments, the rack 300 includes a groove 51. After the tray 1, the linkage member 2, and the operating member 3 of the module ejection mechanism 400 are mounted in the groove 51, a distance H between section heights of the tray 1 and the operating member 3 (for example, a distance calculated along the Y-axis direction by using a base 5 as a bottom shown in FIG. 21) is any distance in a range of 3.4 mm to 4.2 mm, for example, but is not limited to, 3.6 mm, 3.8 mm, or 4.0 mm, thereby reducing occupied space of the rack 300.

Figure 19:
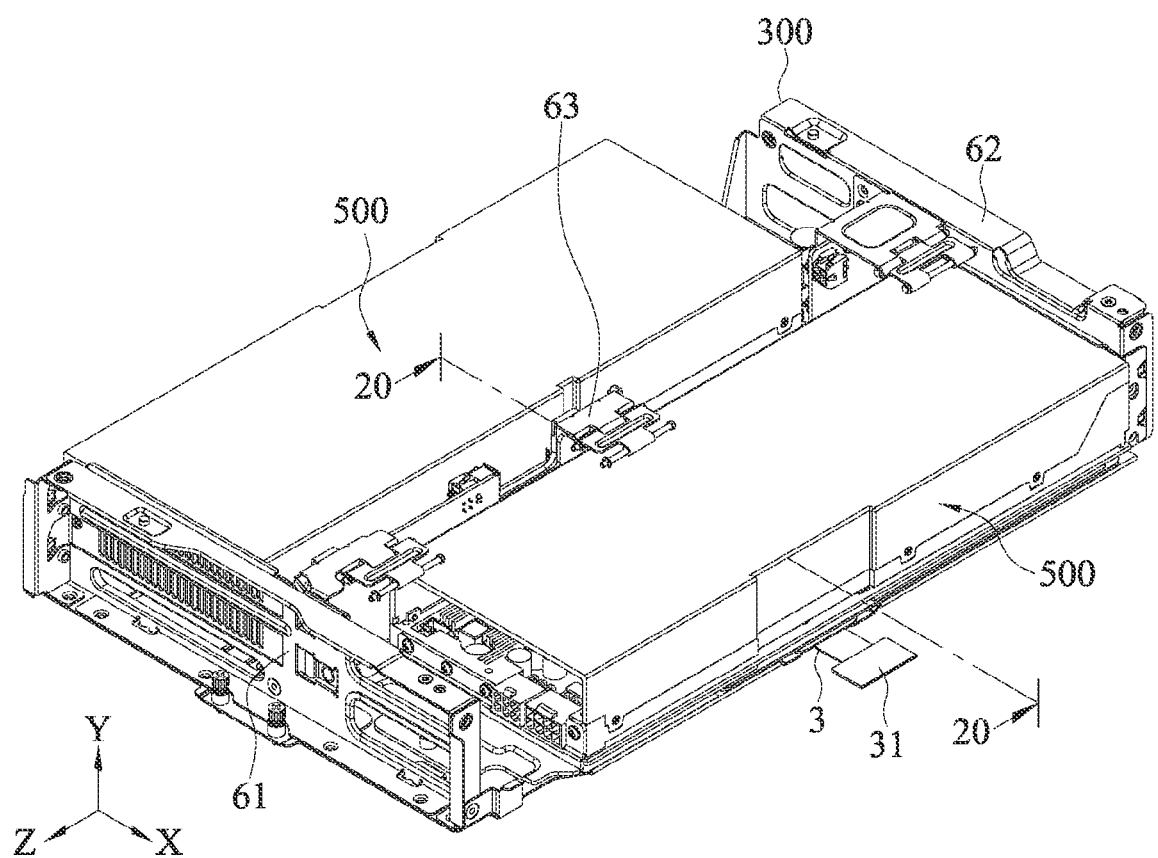
FIG. 19 is a schematic diagram of the appearance of the expansion assembly at a viewing angle of FIG. 2 according to some embodiments, and shows a state of mounting the two expansion modules in the rack and removing the upper cover.

Referring to FIG. 4, FIG. 19, and FIG. 20 at the same time, FIG. 19 is a schematic diagram of the appearance of the expansion assembly 200 at a viewing angle of FIG. 2, and shows a state of mounting the two expansion modules 500 in the rack 300 and removing the upper cover 7. FIG. 20 is a schematic partial cross-sectional diagram of a position labeled 20-20 in FIG. 19, and shows a state that the expansion module 500 is located above the module ejection mechanism 400. In some embodiments, the module ejection mechanism 400 ejects the expansion module 500 by using the abutting element 11. The abutting element 11 is, for example, but not limited to, a side plate structure, where the side plate structure is integrated with the tray 1 and is substantially perpendicular to the tray 1. When a plurality of components are mounted in the rack 300 and are closely arranged, the abutting element 11 may be disposed in a small gap between the components. Generally, there is no excessive layout space in the rack 300. Therefore, the abutting element 11 is located on a side of the expansion module 500 to eject the expansion module 500, and the abutting element 11 does not occupy excessive space, thereby increasing the layout space in the rack 300 relatively.

Figure 22:
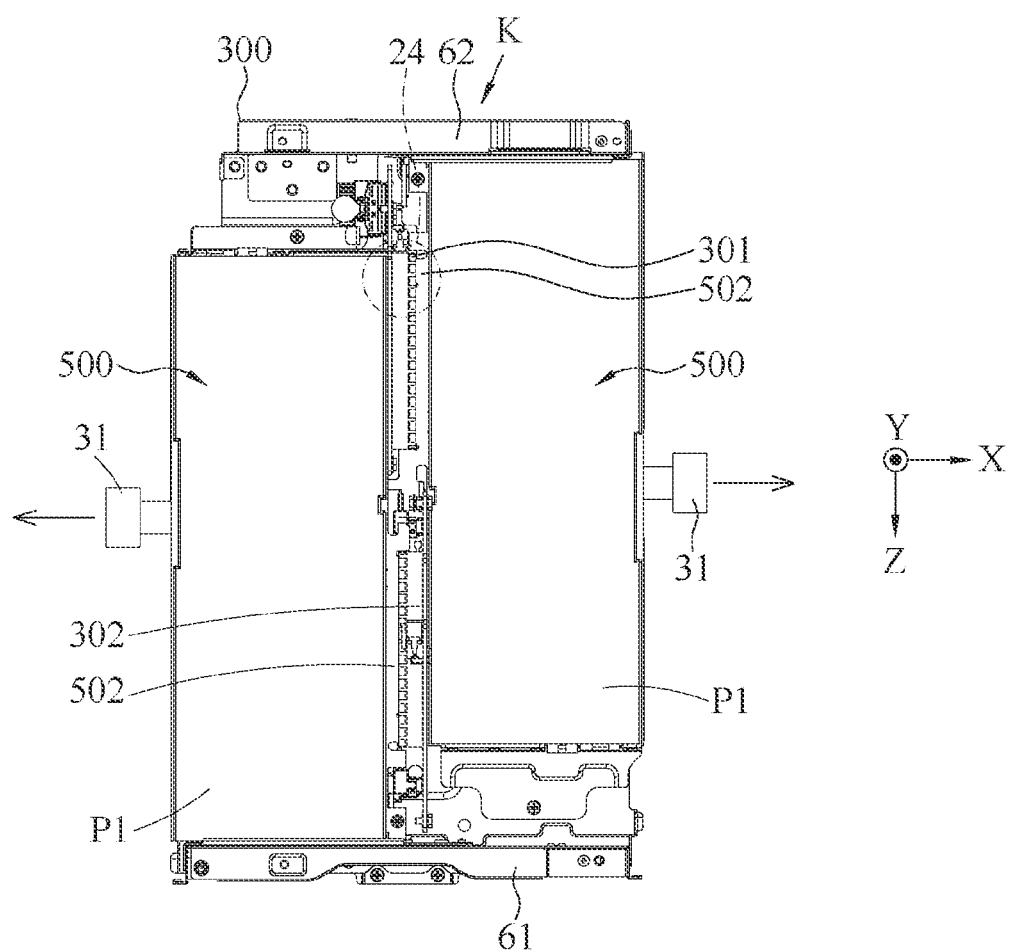
FIG. 22 is a schematic top view of the expansion assembly at a viewing angle of FIG. 2 according to some embodiments, and shows a state of mounting the two expansion modules in the rack and removing the upper cover, and a state before each expansion module ejects from the rack.

Referring to FIG. 4, FIG. 22, and FIG. 23 at the same time, FIG. 22 is a schematic top view of the expansion assembly 200 at a viewing angle of FIG. 2, and shows a state of mounting the two expansion modules 500 in the rack 300 and removing the upper cover 7, and a state before each expansion module 500 ejects from the rack 300. FIG. 23 is a schematic top view of the expansion assembly 200 at a viewing angle of FIG. 2, and shows the state of mounting the two expansion modules 500 in the rack 300 and removing the upper cover 7, and a state after each expansion module 500 ejects from the rack 300. In some embodiments, the tray 1 is slidably disposed on the rack 300 in the ejection direction Q, and the slidable disposition of the tray 1 may be, but is not limited to the following: the tray 1 moves from the first position P1 in the rack 300 to the second position P2 (as shown in FIG. 5 and FIG. 6) in which a portion of the tray 1 is exposed from the rack 300. A portion of the expansion module 500 is exposed from the rack 300 along with a portion of the tray 1, and the expansion module 500 moves from the first position P1 in the rack 300 to the second position P2 (as shown in FIG. 22 and FIG. 23) in which a portion of the expansion module 500 is exposed from the rack 300.

Referring to FIG. 4, FIG. 22, and FIG. 23 at the same time, in some embodiments, when the grip portion 31 is pulled out by the user from one end of the operating member 3 exposed from the rack 300, the tray 1 is driven to move toward the outside of the rack 300, and the tray 1 drives a portion of the expansion module 500 to eject from the rack 300.

Referring to FIG. 2 and FIG. 3 at the same time, in some embodiments, the expansion assembly 200 is adapted to be pluggable to at least one expansion module 500 (one is removed from two expansion modules 500 shown in FIG. 2). The expansion assembly 200 includes the rack 300 and the module ejection mechanism 400.

Figure 24:
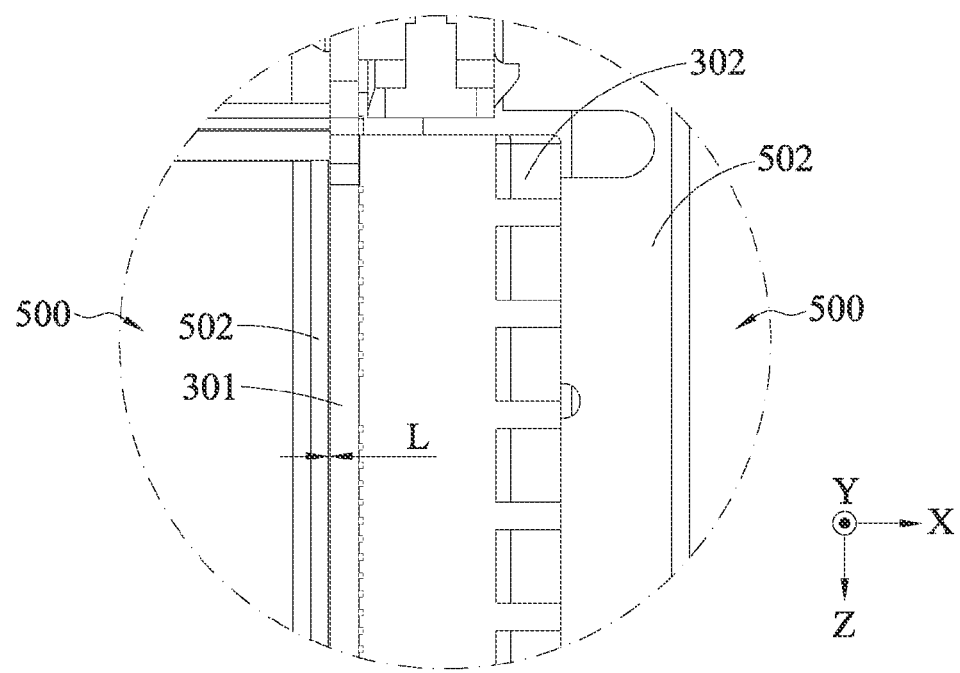
FIG. 24 is an enlarged schematic view of a center line box labeled 24 in FIG. 22, and shows a state that the electrical connection port of the expansion module is connected to the electrical connection port of the rack.
Figure 25:
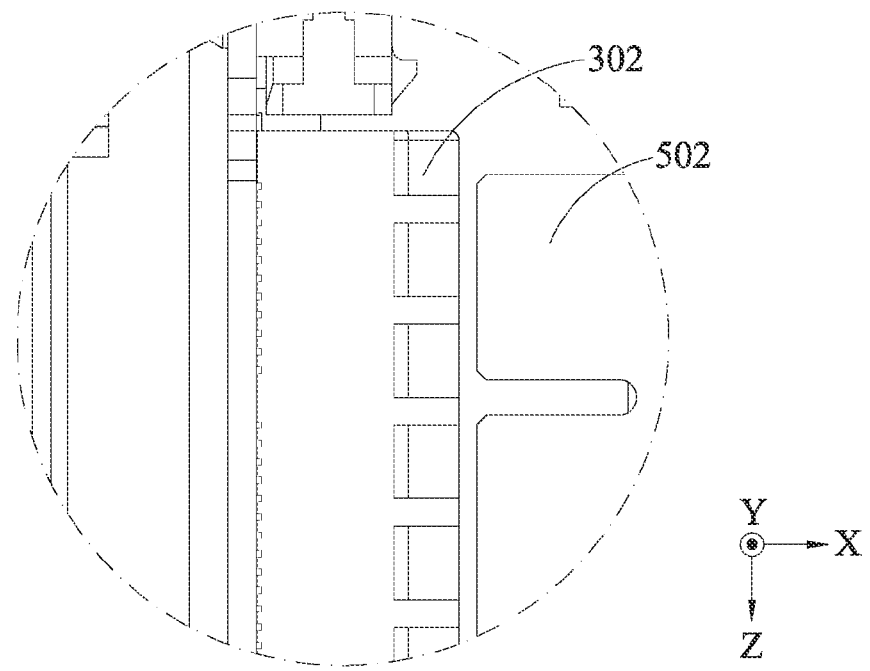
FIG. 25 is an enlarged schematic view of a center line box labeled 25 in FIG. 23, and shows a state that the electrical connection port of the expansion module is separated from the electrical connection port of the rack.

Referring to FIG. 4, and FIG. 22 to FIG. 25 at the same time, FIG. 24 is an enlarged schematic view of a center line box labeled 24 in FIG. 22, and shows a state that the electrical connection port 502 of the expansion module 500 is connected to the electrical connection port 302 of the rack 300. FIG. 25 is an enlarged schematic view of a center line box labeled 25 in FIG. 23, and shows a state that the electrical connection port 502 of the expansion module 500 is separated from the electrical connection port 302 of the rack 300. In some embodiments, the expansion assembly 200 is adapted to be pluggable to the expansion module 500, and the being pluggable may be, but is not limited to the following: When the user inserts the expansion module 500 into the rack 300, the electrical connection port 502 of the expansion module 500 is electrically connected to the electrical connection port 302 (as shown in FIG. 16 and FIG. 23, for example, but not limited to a socket) in the rack 300. When the user ejects the expansion module 500, the module ejection mechanism 400 drives a portion of the expansion module 500 to be exposed from the rack 300, and the electrical connection port 502 of the expansion module 500 is also electrically connected to the electrical connection port 302 in the rack 300, which is a state (not shown) that the electrical connection is not disconnected yet. Alternatively, when the user ejects the expansion module 500, the module ejection mechanism 400 drives a portion of the expansion module 500 to be exposed from the rack 300, and the electrical connection port 502 of the expansion module 500 is not electrically connected to the electrical connection port 302 in the rack 300, which is a state (as shown in FIG. 25) that the electrical connection is disconnected.

Referring to FIG. 2, FIG. 3, and FIG. 22 at the same time, in some embodiments, the rack 300 includes a base 5, a left supporting frame 61, a right supporting frame 62, a middle supporting frame 63, and the upper cover 7. The left supporting frame 61, the right supporting frame 62, and the middle supporting frame 63 are mounted on the base 5, and sections of the left supporting frame 61, the right supporting frame 62, and the middle supporting frame 63 are approximately in an I shape. Two sides of the middle supporting frame 63 include mounting areas 64, and each mounting area 64 is provided for mounting each module ejection mechanism 400 and each expansion module 500. One mounting area 64 includes an upper cover 7, and the upper cover 7 covers one expansion module 500.

Referring to FIG. 16, FIG. 19, and FIG. 22 at the same time, in some embodiments, two expansion modules 500 that are disposed horizontally are respectively mounted in the mounting areas 64 on the two sides of the middle supporting frame 63 side by side. After the two expansion modules 500 that are horizontally disposed are mounted in the mounting areas 64, as shown in FIG. 19, a right side of the lower right expansion module 500 is locked to the right supporting frame 62, and a wiring space pluggable to a transmission line exists between a left side of the lower right expansion module 500 and the left supporting frame 61. As shown in FIG. 19, a left side of the upper left expansion module 500 is locked to the left supporting frame 61, and a wiring space pluggable to a transmission line exists between a right side of the upper left expansion module 500 and the right supporting frame 62. In some embodiments, two electrical connection ports 302 (as shown in FIG. 22) are mounted in the rack 300, and the electrical connection ports 302 are located on two sides of the middle supporting frame 63, so that the electrical connection ports 502 of the expansion modules 500 are electrically connected to the electrical connection ports 302 in the rack 300 respectively.

Figure 13:
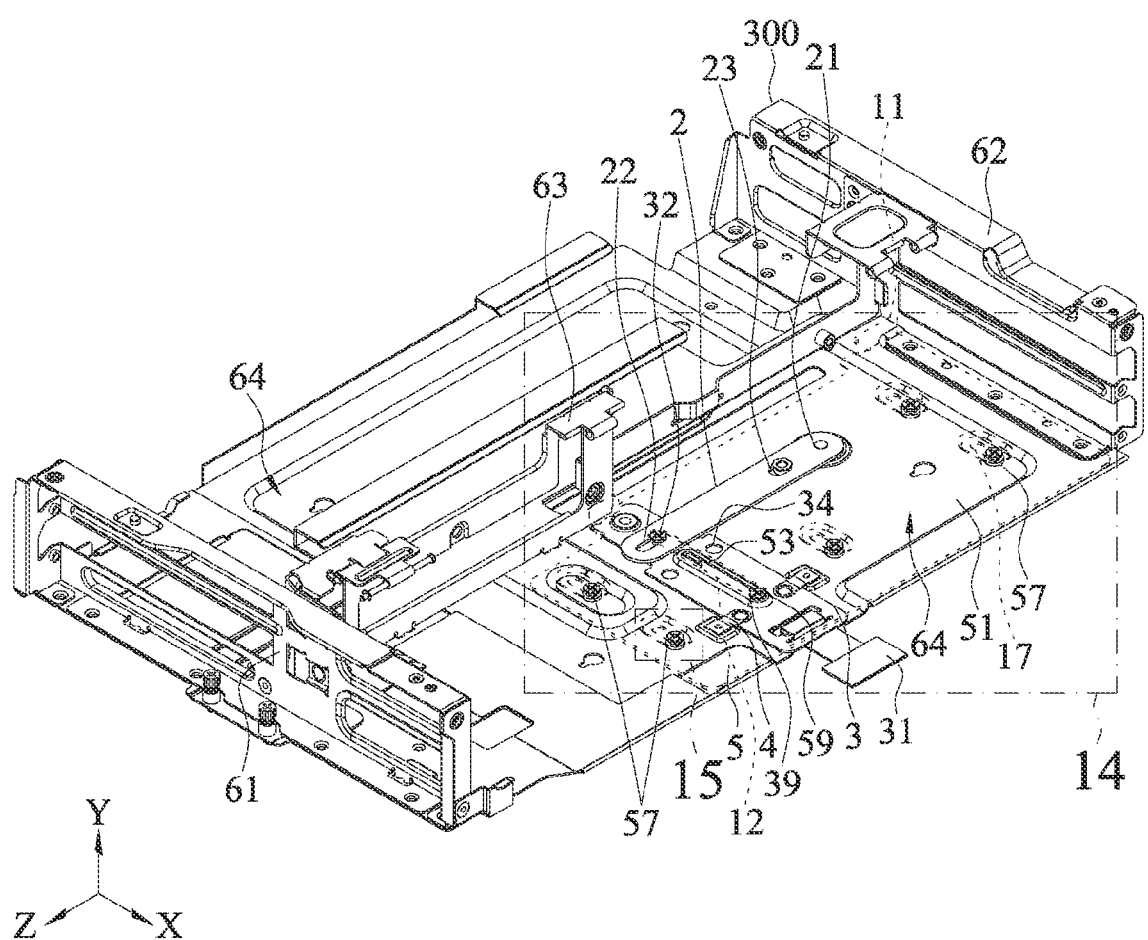
FIG. 13 is a schematic diagram of the appearance of the expansion assembly in FIG. 5, and shows the state of preserving a group of module ejection mechanisms on the rack and the state before the module ejection mechanisms are pulled, where the tray is presented in dotted lines, and the electrical connection port in the rack is not presented.
Figure 14:
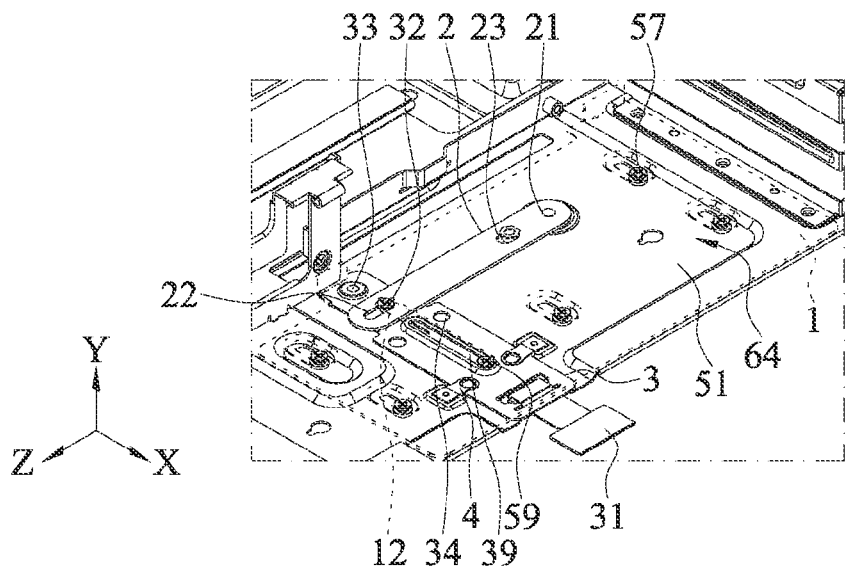
FIG. 14 is an enlarged schematic view of a center line box labeled 14 in FIG. 13, and shows a state before the operating member is pulled, where the electrical connection port in the rack is not presented.
Figure 15:
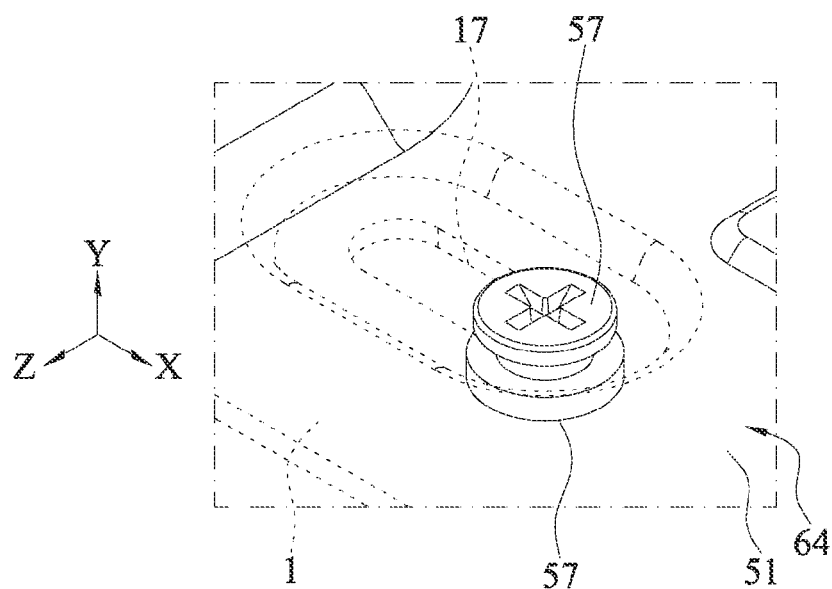
FIG. 15 is an enlarged schematic view of a center line box labeled 15 in FIG. 13, and shows a state before the limiting member and the sliding slot are moved.

Referring to FIG. 2 to FIG. 4 at the same time, in some embodiments, the module ejection mechanism 400 corresponds to at least one expansion module 500. The tray 1 includes a plurality of sliding slots 17, the rack 300 includes a plurality of limiting members 57, and the plurality of limiting members 57 are located on the plurality of sliding slots 17 in a one-to-one manner (as shown in FIG. 13, FIG. 14 and FIG. 15). The limiting member 57 may be a locking member and an engaging member (for example, but not limited to a screw and a nut, the locking member 57 and the engaging member 57 are used as an example for description below and are given the same reference numerals as the limiting member 57). The engaging member 57 is riveted to the rack 300, and the locking member 57 passes through the sliding slot 17 and is locked to the engaging member 57, to limit a degree of freedom of the tray 1 (can only slide on the X axis) on the Y axis and the Z axis as shown in FIG. 6. In some embodiments, the rack 300 includes five limiting members 57 (as shown in FIG. 4), and the tray 1 includes five sliding slots 17. However, the quantity of limiting members 57 and the quantity of sliding slots 17 are not limited thereto. In some embodiments, the rack 300 includes two, three, or four limiting members 57, and the tray 1 includes two, three, or four sliding slots 17 (not shown).

Referring to FIG. 2 to FIG. 4, FIG. 22, and FIG. 23 at the same time, in some embodiments, two electrical connection ports 302 of the expansion assembly 200 are separately located in the rack 300, and the electrical connection ports 302 are arranged in a staggered manner (described below and not shown). The two expansion modules 500, the two module ejection mechanisms 400, and the two electrical connection ports 302 are in one-to-one correspondence.

Figure 26:
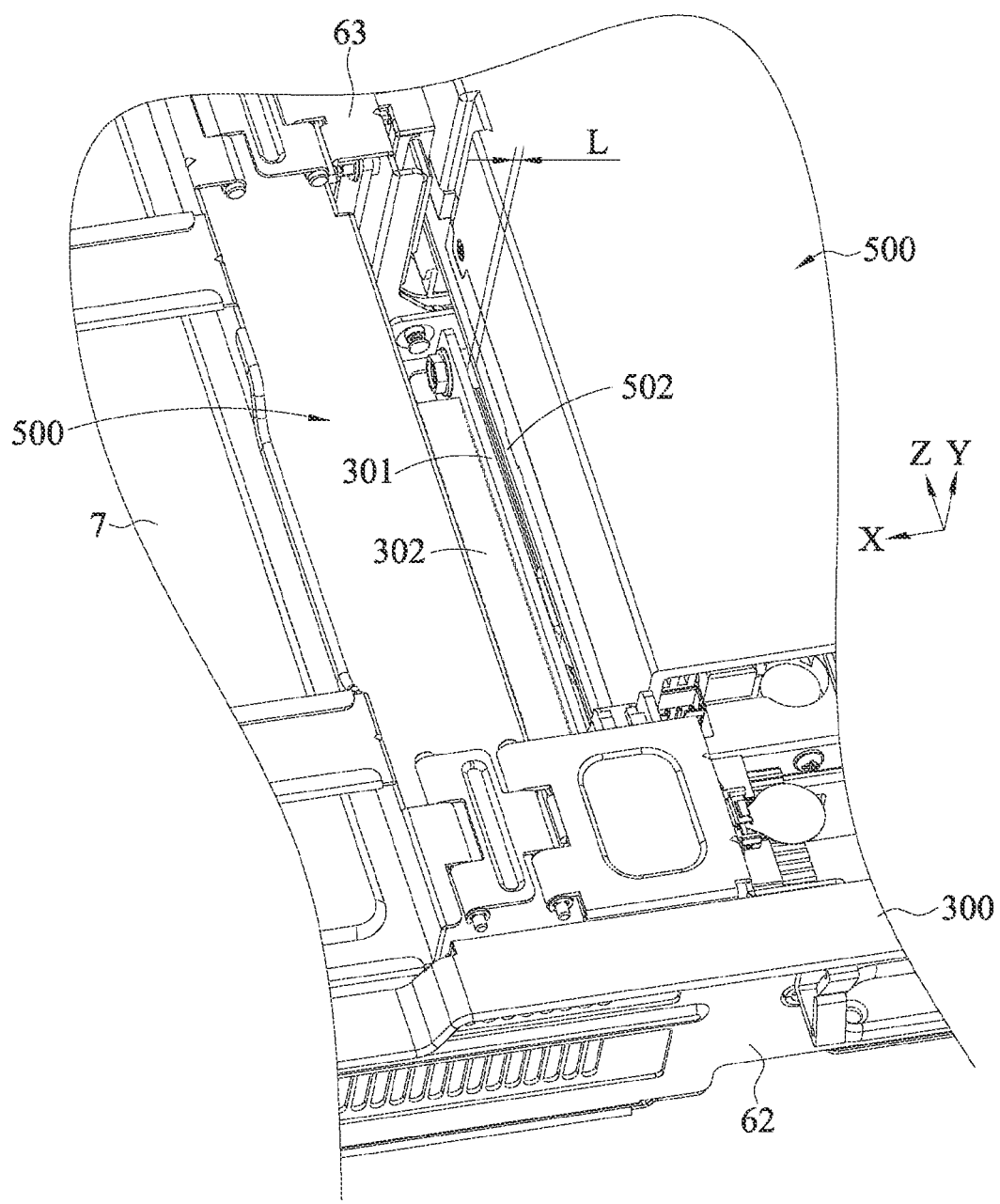
FIG. 26 is a schematic three-dimensional enlarged view at a viewing angle of an arrow labeled K in FIG. 22, and shows a state of mounting the two expansion modules in the rack without removing the upper cover, and a state before each expansion module ejects from the rack.

Referring to FIG. 22, FIG. 24, and FIG. 26 at the same time, FIG. 26 is a schematic three-dimensional enlarged view at a viewing angle of an arrow labeled K in FIG. 22, and shows a state of mounting the two expansion modules 500 in the rack 300 without removing the upper cover 7, and a state before each expansion module 500 ejects from the rack 300. In some embodiments, heights of the electrical connection ports 502 of the two expansion modules 500 in the rack 300 are different (not shown, where a distance between the heights is the distance calculated along the Y-axis direction by using the base 5 as a bottom shown in FIG. 21), and the electrical connection ports 502 of the two expansion modules 500 are staggered (not shown). In some embodiments, a distance L from the electrical connection port 302 on one side (a docking card 301 of the left expansion module 500 as shown in FIG. 26) to the electrical connection port 502 of the expansion module 500 on the same side (the electrical connection port 502 of the right expansion module 500 as shown in FIG. 26) is small, and the distance L is, for example, but is not limited to 0.1 mm. Therefore, the electrical connection ports 502 of the two left and right expansion modules 500 as shown in FIG. 22 and FIG. 26 are in a staggered form in a height space, and are in an arrangement relationship of staggered arrangement, to avoid contact.

Referring to FIG. 2, FIG. 22, and FIG. 23, in some embodiments, the grip portion 31 (for example, but not limited to, a pull strap 31, such as a pull cord or a pull bar) of the module ejection mechanism 400 is exposed from the rack 300. When the user intends to eject the expansion module 500, the pull strap 31 exposed from the rack 300 is pulled, so that the module ejection mechanism 400 drives a portion of the expansion module 500 to be exposed from the rack 300.

Referring to FIG. 2, FIG. 5, and FIG. 22, in some embodiments, the operating member 3 is located in the center of the rack 300 substantially (not shown, for example, referring to FIG. 5 at the same time, a position of the operating member 3 corresponds to the center of the rack 300 in FIG. 23), and the position of the operating member 3 corresponds to the center of the expansion module 500 substantially. When the user pulls the operating member 3, because the position of the operating member 3 corresponds to a position of the center of the expansion module 500, an applied pulling force is averagely distributed in the whole expansion module 500 in the center of the expansion module 500, to actually drive the tray 1 and the expansion module 500 on the tray to eject from the rack 300.

Referring to FIG. 2, FIG. 5, and FIG. 22, in some embodiments, the resisting portion 23 of the linkage member 2 substantially corresponds to the center of the electrical connection port 502 of the expansion module 500 (not shown, for example, referring to FIG. 5 at the same time, a position of the resisting portion 23 corresponds to the center of the electrical connection port 502 in FIG. 23), and the resisting portion 23 is located in the center of the tray 1 substantially. When the user pulls the operating member 3, the operating member 3 drives the linkage member 2 to rotate, and the resisting portion 23 of the linkage member 2 averagely applies a pulling force to the center of the tray 1, to actually drive the tray 1 and the expansion module 500 on the tray to eject from the rack 300. Specifically, when the electrical connection port 502 of the expansion module 500 is inserted into the electrical connection port 302 in the rack 300, to closely fit, the resisting portion 23 is located in the center of the tray 1 to effectively drive the tray 1 to move.

In summary, according to some embodiments, the module ejection mechanism drives the expansion module to eject from the rack. When the operating member of the module ejection mechanism is operated to be moved, the operating member is linked with the linkage member to pivot, and the linkage member drives the tray to move in the ejection direction, so that the expansion module on the tray ejects from the rack. The module ejection mechanism is mounted on the rack, and the structure of the rack does not need to be damaged, to ensure the integrity and the structural strength of the whole rack. In addition, according to some embodiments, the module ejection mechanism is mainly assembled on the rack by using the tray, the linkage member, and the operating member, and the volume of the tray, the linkage member, and the operating member is small, so that a gap between the rack and the expansion module is effectively used for assembly. Moreover, according to some embodiments, the pivoting portion of the linkage member is a pivot point pivoted to the rack, the resisting portion of the linkage member is pivoted to the tray, the operating member is moved, and the linkage portion of the linkage member is driven to pivot, so that the linkage member operates by using a lever, and the resisting portion drives the tray to move in the ejection direction.

What is claimed is:

1. A module ejection mechanism, disposed on a rack, the module ejection mechanism comprising:
   a tray, slidably disposed on the rack in an ejection direction, and comprising an abutting element;
   a linkage member, comprising a pivoting portion, a linkage portion, and a resisting portion, wherein the pivoting portion is pivoted on the rack; and
   an operating member, wherein one end of the operating member comprises a grip portion, the other end of the operating member is connected to the linkage portion; when the operating member moves in an operating direction, the operating member is linked with the linkage portion to pivot the linkage member, and when the linkage member pivots, the resisting portion enables the tray to move in the ejection direction, wherein
   the resisting portion is connected to the tray in a first pivoting-sliding relationship, and the other end of the operating member is connected to the linkage portion in a second pivoting-sliding relationship.

2. The module ejection mechanism according to claim 1, wherein the operating direction is substantially parallel to the ejection direction, and the operating direction is substantially the same as the ejection direction.

3. The module ejection mechanism according to claim 1, wherein the resisting portion is located between the pivoting portion and the linkage portion, or the linkage portion is located between the pivoting portion and the resisting portion, and the operating member moves in a pulling manner in the operating direction.

4. The module ejection mechanism according to claim 1, wherein the pivoting portion is located between the resisting portion and the linkage portion, and the operating member moves in a pushing manner in the operating direction.

5. The module ejection mechanism according to claim 1, wherein the tray comprises a protruding member, the resisting portion is a first long slot, a portion of the protruding member is located in the first long slot, and a portion of the protruding member is located on one of two sides of the first long slot.

6. The module ejection mechanism according to claim 1, wherein the operating member comprises a pivoting member, the linkage portion is a second long slot, a portion of the pivoting member is located in the second long slot, and a portion of the pivoting member is located on one of two sides of the second long slot.

7. The module ejection mechanism according to claim 6, wherein the tray comprises a groove, and a portion of the pivoting member is located in the groove.

8. The module ejection mechanism according to claim 1, wherein the tray comprises a plurality of abutting elements.

9. The module ejection mechanism according to claim 1, further comprising an elastic sheet, wherein one side of the elastic sheet is fixed to the rack, and the operating member has two fastening holes; and before the operating member is moved in the operating direction, the elastic sheet on the other side selectively fastens one of the two fastening holes, and after the operating member is moved in the operating direction, the elastic sheet on the other side selectively fastens the other one of the two fastening holes.

10. The module ejection mechanism according to claim 1, further comprising two elastic sheets, wherein one side of each of the elastic sheets is fixed on the rack, and the operating member has four fastening holes; and before the operating member is moved in the operating direction, the elastic sheets on the other two sides selectively fasten two of the four fastening holes, and after the operating member is moved in the operating direction, the elastic sheets on the other two sides selectively fasten the other two of the four fastening holes.

11. The module ejection mechanism according to claim 1, wherein a distance between the resisting portion and the pivoting portion is 17.85 mm to 21.85 mm, and a distance between the pivoting portion and the linkage portion is 77.85 mm to 81.85 mm.

12. The module ejection mechanism according to claim 1, wherein a distance between section heights of the tray and the operating member is 3.4 mm to 4.2 mm.

13. The module ejection mechanism according to claim 1, wherein the operating direction is parallel to the ejection direction, and the operating direction is substantially the same as the ejection direction; the resisting portion is located between the pivoting portion and the linkage portion, the operating member moves in a pulling manner in the operating direction, the tray comprises a protruding member, the resisting portion is a first long slot, a portion of the protruding member is located in the first long slot, and a portion of the protruding member is located on one of two sides of the first long slot; the operating member comprises a pivoting member, the linkage portion is a second long slot, a portion of the pivoting member is located in the second long slot, and a portion of the pivoting member is located on one of two sides of the second long slot; the tray comprises a groove, and a portion of the pivoting member is located in the groove; the tray comprises a plurality of abutting elements; the module ejection mechanism further comprises two elastic sheets, wherein one side of each of the elastic sheets is fixed on the rack, and the operating member has four fastening holes; and before the operating member is moved in the operating direction, the elastic sheets on the other two sides selectively fasten two of the four fastening holes, and after the operating member is moved in the operating direction, the elastic sheets on the other two sides selectively fasten the other two of the four fastening holes; and a distance between the resisting portion and the pivoting portion is 17.85 mm to 21.85 mm, a distance between the pivoting portion and the linkage portion is 77.85 mm to 81.85 mm, and a distance between section heights of the tray and the operating member is 3.4 mm to 4.2 mm.

14. An expansion assembly, comprising:
a rack; and
a module ejection mechanism, comprising a tray, a linkage member, and an operating member, wherein the tray is slidably disposed on the rack in an ejection direction, the tray comprises an abutting element, the linkage member comprises a pivoting portion, a linkage portion, and a resisting portion, the pivoting portion is pivoted on the rack, one end of the operating member comprises a grip portion, the other end of the operating member is connected to the linkage portion, the operating member moves in an operating direction, the operating member is linked with the linkage portion to pivot the linkage member, and when the linkage member pivots, the resisting portion enables the tray to move in the ejection direction; and the tray comprises a plurality of sliding slots, the rack comprises a plurality of limiting members, and the limiting members are located in the sliding slots in a one-to-one manner, wherein
when the tray moves, the limiting members are respectively limited in the sliding slots to enable the tray to move in the ejection direction.

15. The expansion assembly according to claim 14, adapted to be pluggable to two expansion modules, wherein the expansion assembly comprises two module ejection mechanisms and two electrical connection ports, the electrical connection ports are arranged in a staggered manner, and the two expansion modules, the two module ejection mechanisms, and the two electrical connection ports are in one-to-one correspondence.

16. The expansion assembly according to claim 14, wherein the grip portion of the module ejection mechanism is exposed from the rack, the module ejection mechanism is adapted to eject at least one expansion module, and when the expansion module is ejected, a portion of the expansion module is exposed from the rack, the operating member of the module ejection mechanism is located in the center of the rack substantially, and the operating member of the module ejection mechanism is correspondingly located in the center of the expansion module substantially.

17. The expansion assembly according to claim 16, wherein the resisting portion of the module ejection mechanism substantially corresponds to the center of an electrical connection port of the expansion module.

18. The expansion assembly according to claim 14, wherein the operating member of the module ejection mechanism comprises a positioning slot, the rack comprises a positioning member, a portion of the positioning member is located in the positioning slot, and a portion of the positioning member is selectively located on one of two sides of the positioning slot.

19. The expansion assembly according to claim 14, wherein the operating member of the module ejection mechanism comprises a convex portion, the rack comprises a limiting slot, a portion of the convex portion is located in the limiting slot, and a portion of the convex portion is selectively located on one of two sides of the limiting slot.

20. The expansion assembly according to claim 14, adapted to be pluggable to two expansion modules, wherein the expansion assembly comprises two module ejection mechanisms and two electrical connection ports, the electrical connection ports are arranged in a staggered manner, and the two expansion modules, the two module ejection mechanisms, and the two electrical connection ports are in one-to-one correspondence; the grip portion of the module ejection mechanism is exposed from the rack, and when the expansion module is ejected, a portion of the expansion module is exposed from the rack, the operating member of the module ejection mechanism is located in the center of the rack substantially, and the operating member of the module ejection mechanism is correspondingly located in the center of the expansion module substantially; the operating member of the module ejection mechanism comprises a positioning slot, the rack comprises a positioning member, a portion of the positioning member is located in the positioning slot, and a portion of the positioning member is selectively located on one of two sides of the positioning slot; the operating member of the module ejection mechanism comprises a convex portion, the rack comprises a limiting slot, a portion of the convex portion is located in the limiting slot, and a portion of the convex portion is selectively located on one of two sides of the limiting slot; and the resisting portion of the module ejection mechanism substantially corresponds to the center of an electrical connection port of the expansion module.

21. The expansion assembly according to claim 14, adapted to be pluggable to a plurality of expansion modules, wherein the expansion assembly comprises a plurality of module ejection mechanisms, the expansion modules and the module ejection mechanisms are in one-to-one correspondence, the expansion modules are horizontally disposed in the rack side by side or are vertically disposed in the rack in a stacked manner, and the expansion modules are symmetrically or asymmetrically arranged.

* * * * *